(12) United States Patent
Tanaka

(10) Patent No.: US 6,781,944 B1
(45) Date of Patent: Aug. 24, 2004

(54) OPTICAL INFORMATION PROCESSOR WITH MONOLITHICALLY INTEGRATED LIGHT EMITTING DEVICE, LIGHT RECEIVING DEVICES AND OPTICS

(75) Inventor: Toshiaki Tanaka, Cambridge (GB)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/913,397
(22) PCT Filed: Feb. 9, 2000
(86) PCT No.: PCT/JP00/00697
§ 371 (c)(1),
(2), (4) Date: Aug. 14, 2001
(87) PCT Pub. No.: WO00/51115
PCT Pub. Date: Aug. 31, 2000

(30) Foreign Application Priority Data

Feb. 25, 1999 (JP) .......................................... 11-047300

(51) Int. Cl.[7] ............................................. G11B 7/135
(52) U.S. Cl. ............................... 369/112.12; 369/44.12; 369/120; 369/112.08
(58) Field of Search ......................... 369/44.12, 44.23, 369/112.02, 112.05, 112.08, 112.09, 112.13, 112.14, 112.2, 112.21, 112.23, 112.25, 112.27, 120–122, 110.03–110.04, 112.07, 112.12

(56) References Cited

U.S. PATENT DOCUMENTS

| | | | | |
|---|---|---|---|---|
| 5,125,750 A | * | 6/1992 | Corle et al. .................. | 359/819 |
| 5,481,386 A | * | 1/1996 | Shimano et al. .......... | 369/44.12 |
| 5,497,359 A | * | 3/1996 | Mamin et al. ............ | 369/44.15 |
| 6,272,097 B1 | * | 8/2001 | Nakao et al. ........... | 369/112.08 |
| 6,584,060 B1 | * | 6/2003 | Oohchida et al. ...... | 369/112.05 |

FOREIGN PATENT DOCUMENTS

| | | | |
|---|---|---|---|
| EP | 0814468 | * | 12/1997 |
| JP | 4-319540 | * | 11/1992 |
| JP | 6-132609 | * | 5/1994 |
| JP | 6-188518 | * | 7/1994 |
| JP | 7-64024 | * | 3/1995 |
| JP | 8-212584 | * | 8/1996 |
| JP | 9-17009 | * | 1/1997 |
| JP | 9-128790 | * | 5/1997 |
| JP | 10-269613 | * | 10/1998 |
| JP | 10-302291 | * | 11/1998 |
| JP | 11-259894 | * | 9/1999 |
| JP | 2000-22277 | * | 1/2000 |

OTHER PUBLICATIONS

Shuji Nakamura, Masayuki Senoh, Shin–ichi Nagahama, Naruhito Iwasa, Takao Yamada, Toshio Matsushita, Hiroyuki Kiyoku and Yasanobu Sugimoto, "InGaN–Based Multi–Quantum–Well–Structure Laser Diodes," Jpn. J. Appl. Ohys. vol. 35 (1996) pp. L 74–L 76.

* cited by examiner

Primary Examiner—W. R. Young
(74) Attorney, Agent, or Firm—Reed Smith LLP; Stanley P. Fisher, Esq.; Juan Carlos A. Marquez, Esq.

(57) ABSTRACT

In an optical head of a DVD drive, a light-emitting device and light-receiving devices are disposed on one face of a substrate, and on the other face of the substrate, a diffraction light separating device, a $\lambda/4$ plate, and a dielectric plate having a converging focus lens are sequentially, hierarchically integrated. With the configuration, a laser beam (transmission beam) emitted from the front light-outgoing end of the semiconductor laser device sequentially passes through the diffraction light separating device, $\lambda/4$ wave plate, and dielectric plate having the converging focus lens to form an image on a recording face of a recording medium (optical recording medium). A reflected beam reflected by the recording face returns reversely along the optical path through which the transmission beam has traveled, the phase of the reflected beam is changed by the $\lambda/4$ wave plate, and the phase-changed reflected beam is separated into two primary diffracted beams in two directions. The primary diffracted beams fall on the light-receiving faces of the respective light-receiving devices. As a result, information can be reproduced and/or recorded by near-field recording.

22 Claims, 16 Drawing Sheets

OPTICAL INFORMATION PROCESSOR WITH MONOLITHICALLY INTEGRATED LIGHT EMITTING DEVICE, LIGHT RECEIVING DEVICES AND OPTICS

BACKGROUND OF THE INVENTION

The present invention relates to an optical information processor capable of processing signals at high speed and at high recording density.

Hitherto, in applications of an optical information processor, in order to read/record high-density information (optical memory) from/to a recording medium such as an optical disk, it is indispensable to shorten the wavelength of a semiconductor laser as a light source. As an example of conventional techniques, a blue-violet laser having the shortest wavelength out of semiconductor laser devices is described in Japanese Journal Applied Physics Letters, Vol. 35, 1996, pp. L74 to L76.

The conventional technique, however, can utilize the features of only the light source and does not contribute to reduction in size and weight of an optical head including optical devices such as a light-emitting device and a light-receiving device and an optical system in an optical pickup mechanism. The conventional technique does not have a system configuration for processing an optical signal by near-field recording which converges a laser beam emitted from a light-emitting device to a near field pattern by an integrated focusing lens and forms a very small spot on a recording medium (optical recording medium). In the near-field recording, information can be recorded/read to/from a memory smaller than that determined by the wavelength of a laser beam and the numerical aperture of an optical system lens, so that recording of higher density can be achieved.

SUMMARY OF THE INVENTION

The conventional technique uses the configuration of an existing optical head and cannot achieve reduction in size and weight of an optical head and address to a demand of higher processing speed. Consequently, the features of only the light source do not contribute to a higher-speed access of an optical information processor.

FIG. 26 is a schematic diagram showing a conventional optical pickup mechanism. A transmission beam (laser beam) 13 emitted from a light-emitting device (semiconductor laser device) 7 sequentially passes through a polarized light separating diffraction grating 6 and a λ/4 wave plate 5. An optical path 10 is changed by a beam splitter 4 and also by a reflecting mirror 3. The beam passes through an objective lens 2 and is focused on a recording surface of a recording medium (optical recording medium, disk) 1 to form an image. A reflected beam 24 reflected by the recording medium 1 passes through the objective lens 2 and is reflected by the reflecting mirror 3 and passes through the beam splitter 4. After that, the beam is condensed by a condenser lens 8 onto a light-receiving face of a light-receiving device 9.

As described above, the conventional optical pickup mechanism is constructed by discrete optical devices and the optical devices are optically connected via a space, so that the volume is large and weight is heavy. The dimensions of the mechanism are, for example, about 60×40×10 mm.

The inventor herein has found that a small, light optical head can be formed by integrating a light-emitting device (semiconductor laser) and a light-receiving device on the same substrate in a flat shape, allowing a laser beam (transmission beam) emitted from the light-emitting device to travel perpendicular to a substrate face, and integrating a diffraction light separating device and a condensing device (lens) hierarchically in the direction perpendicular to the substrate.

It was also confirmed that, with the configuration, by designing each of the devices in consideration of the outgoing direction of the transmission beam and reception of a condensed beam and a diffracted beam, an optical information processor capable of recording/reproducing information to/from a recording mark in a recording medium by near-field recording which converges a beam to a near-field pattern and diffraction beam splitting control, and performing high-density recording and reproduction at high speed which cannot be achieved by the conventional techniques can be achieved.

An object of the invention is to provide an optical information processor capable of recording information at high recording density and reproducing the information at high speed.

The above and other objects and novel features of the invention will become apparent from the description of the specification and the appended drawings.

The outline of representative ones of inventions disclosed in the application will be briefly described as follows.

(1) An optical information processor having a light-emitting device, a light-receiving device, and a plurality of optical devices positioned in an optical path and for controlling light, constructing an optical system for forming an image on a recording face of a recording medium by a transmission beam emitted from a front light-outgoing end of the light-emitting device and for forming an image on a light-receiving face of the light-receiving device by a reflected beam reflected by the recording face, and reproducing information recorded on the recording medium and/or recording information to the recording medium, including: a substrate having, on one face thereof, a light-emitting device (semiconductor laser device) for emitting a transmission beam in an in-plane direction and a plurality of light-receiving devices for receiving reflected beams of the transmission beam from the inside of the plane, which is made of a base material capable of forming the light-emitting device and the light-receiving devices by crystal growth and an insulating material through which the transmission beam and the reflected beam pass; a diffraction light separating device stacked on the other face of the substrate, for correcting and changing an optical path so that the reflected beams from the recording medium are received by the light-receiving device; a λ/4 wave plate stacked on the diffraction light separating device; and a dielectric plate stacked on the λ/4 wave plate, constructing a lens for converging the transmission beam onto a recording face of the recording medium and converging the reflected beam from the recording medium onto the substrate side.

The substrate, the diffraction light separating device, the λ/4 wave plate, and the dielectric plate are integrated mechanically and physically, and construct an optical head attached to a suspension arm of an optical pickup mechanism of an optical information processor. The optical head is light to an extent that it can bear a high-speed swing. The substrate, the diffraction light separating device, the λ/4 wave plate, and the dielectric plate are bonded by an intermolecular force of thermo compression bonding under high vacuum of about $10^{-9}$ to $10^{-10}$ Torr.

The lens is constructed so as to form an image as a near field image on a recording face of a recording medium by the transmission beam and to reproduce/record information of near-field recording from/to the recording medium. The near field image is formed in a range from a few nm to a few hundreds nm from the surface of the dielectric plate.

Each of the lens and the diffraction light separating device is formed by a diffraction grating, when a diffraction grating lens is used as the lens, the reflected beam is diffracted to generate a primary diffracted beam, the diffracted primary beam is separated via the diffraction light separating device, and separated beams are received by the light-receiving devices. The diffraction grating is constructed by at least two kinds of areas having different refractive indices and is, desirably formed in a crystal having high anisotropy. At least two kinds of areas having different refractive indices in the diffraction grating are formed by diffusion of an impurity or ion implantation.

The light-emitting device is a semiconductor laser formed from a semiconductor crystal as a base formed by selective growth using an insulating mask on one face of the substrate, an active layer for emitting a laser beam from its end face is disposed along a direction perpendicular to one face of the substrate on which the light-emitting device is provided, and induced-emission light is resonated and amplified in a direction perpendicular to the substrate face. A reflection film is provided at both ends of the active layer of the light-emitting device, the reflection film of the front light-outgoing end of the active layer is constructed by the insulating mask used for selectively growing a semiconductor crystal on one face of the substrate, and reflectance of the reflection film at the front outgoing end is lower than that of the reflection film of the other end. The active layer of the light-emitting device has a multi-quantum-well structure or a strained multi-quantum-well structure obtained by introducing a lattice distortion into a quantum well layer.

A light-receiving area of the light-emitting device is a face-type light-receiving area or a waveguide type light-receiving area. The light-receiving device is formed by using a semiconductor crystal as a base formed by selective growth using an insulating mask on one face of the substrate. The light-emitting device and the light-receiving device are formed monolithically on the substrate.

(2) In the configuration of (1), the substrate, the diffraction light separating device, the $\lambda/4$ plate, and the dielectric plate are bonded by a transparent bonding material.

(3) In the configuration of (1) or (2), a reflector for reflecting a peripheral portion of the transmission beam emitted from the light-emitting device is provided between the diffraction light separating device and the $\lambda/4$ wave plate, a light-receiving device for detecting an optical output of the transmission beam is provided on one face of the substrate, and the reflected beam of the transmission beam reflected by the reflector falls on a light-receiving face of the light-receiving device for detecting the optical output of the transmission beam.

(4) In the configurations of (1) to (3), a modulator for controlling the transmission beam emitted from the light-emitting device is provided on the substrate portion at the front light-outgoing end side of the light-emitting device.

(5) In the configurations of (1) to (4), the substrate, the diffraction light separating device, the $\lambda/4$ plate, and the dielectric plate are formed monolithically.

According to the means (1), the following effects are produced.

(a) In the optical head of the optical information processor, the transmission beam emitted from the front light-outgoing end of the light-emitting device (semiconductor laser device) sequentially passes through the substrate, diffraction light separating device, $\lambda/4$ wave plate, and dielectric plate having the lens to form an image on the recording face of the recording medium (optical recording medium). The reflected beam reflected by the recording face goes back through the optical path through which the transmission beam has passed. The phase of the reflected beam is changed by the $\lambda/4$ wave plate, and the phase-changed reflected beam is separated into two primary diffracted beams in two directions. The primary diffracted beams fall on the light-receiving faces of the respective light-receiving devices. Thus, information can be reproduced and/or recorded by near-field recording.

(b) The substrate having the light-emitting device and the light-receiving device, diffraction light separating device, $\lambda/4$ wave plate, and dielectric plate having the lens are sequentially hierarchically integrated, and mechanically, physically integrated. Thus, the optical head having the functionality which cannot be realized by the conventional techniques and realizing small size and light weight can be provided. For example, the dimensions of the optical head can be set to 5 mm, 5 mm, and 9 mm. In the structure where the optical head is attached to the suspension arm of the optical pickup mechanism, therefore, the suspension arm can be swung at high speed like the head of a hard disk, and recording and reproduction can be performed at high speed also in the optical information processor (DVD drive).

(c) Since the substrate having the light-emitting device and the light-receiving device, diffraction light separating device, $\lambda/4$ wave plate, and dielectric plate having the lens are integrated mechanically and physically, the optical path can be made extremely short, so that efficiency for utilization of the laser beam can be improved remarkably. By the reduction in the optical path, an access time of focus/tracking correction and reading (reproduction) with respect to the recording mark in the optical recording medium can be shortened, so that the higher-speed optical information process can be achieved.

(d) Since the substrate having the light-emitting device and the light-receiving device, diffraction light separating device, $\lambda/4$ wave plate, and dielectric plate having the lens are integrated mechanically and physically, no air exists in the optical paths of the transmission beam and the reflected beam, so that the optical loss can be suppressed very much. Thus, improved transmission beam output of the semiconductor laser device and increased light-receiving sensitivity of the light-receiving device can be achieved. Particularly, in the structure that the substrate, diffraction light separating device, $\lambda/4$ wave plate, and dielectric plate are bonded by an intermolecular force, an optical loss is smaller, and improved transmission beam output and increased light-receiving sensitivity of the light-receiving device are achieved, thereby increasing the performance of the optical information processor.

(e) By the above-described (c) and (d), in the optical pickup mechanism in the optical information processor, by the shortened optical path and reduced optical loss, the laser beam output can be lowered. Thus, power consumption for laser oscillation can be lowered.

(f) Since the near field recording can be performed, higher-density recording of the optical information processor can be achieved.

(g) As each of lens and the diffraction light separating device is formed by the diffraction grating having two kinds of areas formed by impurity diffusion or ion implantation, the devices can be easily fabricated with high precision, and lower cost of the optical head can be achieved.

(h) The light-emitting device (semiconductor laser device) and the light-receiving device can be formed monolithically on the substrate by the semiconductor manufacturing technique. Consequently, they can be fabricated with high precision at low cost and lower cost of the optical head can be achieved.

(i) Since the reflectance of the reflection film of the front light-outgoing end of the semiconductor laser device (light-emitting device) is lower than that of the reflection film at the other end, improved optical output of the transmission beam can be achieved. The reflection film at the front light-outgoing end is formed by an insulating mask used at the time of forming the semiconductor crystal by selective growth to form the semiconductor laser device, reduction in the manufacturing cost can be achieved.

(j) The semiconductor laser device has a multi-quantum-well structure or a strained multi-quantum-well structure obtained by introducing grating distortion into a quantum-well layer, a higher output of the laser beam can be achieved.

(k) The light-receiving area of the light-receiving device has a face-type light-receiving area or the waveguide type light-receiving area. Consequently, a reflected beam can be efficiently detected as a reception signal. Thus, on the basis of detection signals of the light-receiving devices, focus correction, tracking correction and, further, optical output control of the transmission beam can be carried out, and the optical information processor having high controllability can be provided.

According to the means of (2), effects similar to those of the configuration of (1) can be produced.

According to the means of (3), in addition to the effects of the configurations (1) and (2), since the laser beam portion emitted from the semiconductor laser device and is not converged on the recording face of the recording medium is reflected by the reflector provided between the diffraction light separating device and the λ/4 wave plate and the reflected beam is detected by the light-receiving device for detecting an optical output, the optical output control (APC control) of the laser beam can be effectively performed.

According to the means of (4), in addition to the effects by the configurations (1) to (3), the transmission beam emitted from the semiconductor laser device can be controlled by the modulator.

According to the means of (5), in addition to the effects by the configurations (1) to (4), since the substrate, diffraction light separating device, and λ/4 wave plate are monolithically formed, the optical loss in the interfaces of the substrate, diffraction light separating device, and λ/4 wave plate becomes extremely small. Thus, improved efficiency for laser beam utilization is achieved.

DESCRIPTION OF THE PREFERRED EMBODIMENTS

Figure 1:
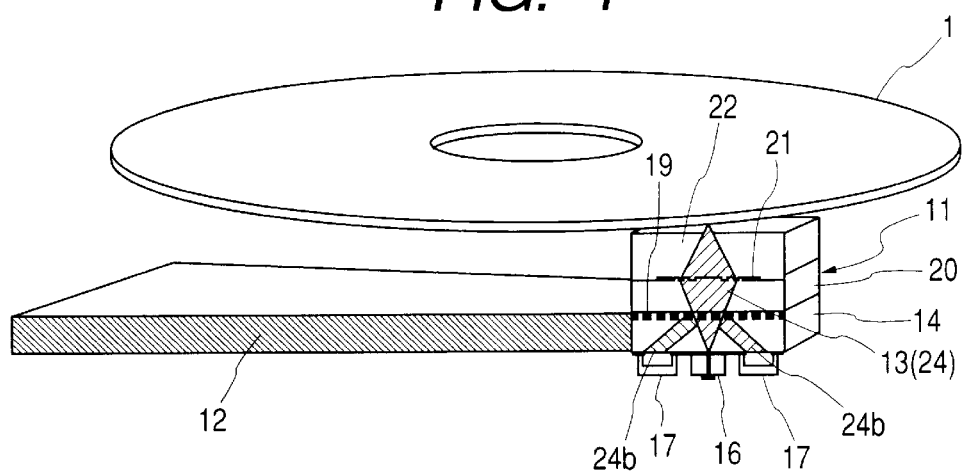
FIG. 1 is a schematic diagram showing a part of an optical pickup mechanism of a DVD drive as an embodiment (first embodiment) of the invention.

Embodiments of the invention will be described in detail hereinbelow with reference to the drawings. In all of the drawings for explaining the embodiments of the invention, components having the same function are designated by the same reference numeral and repetitive description will not be given.

Embodiment I

FIGS. 1 to 12 are diagrams related to an optical information processor as an embodiment (first embodiment) of the invention.

In the invention, a very-small, light optical head in an optical pickup mechanism in an optical information processor is realized. Access time is largely shortened by operating a suspension arm as a slider to which the optical head is attached at high speed, and high-density recording is realized by near-field recording.

Specifically, an optical head has a configuration that a light-emitting device (semiconductor laser device) and a plurality of light-receiving devices are provided on one face of a substrate and, on the other face of the substrate, a diffraction light separating device, a λ/4 wave plate, and a dielectric plate having a converging focus lens are sequentially hierarchically integrated. Those parts are bonded by an intermolecular force of thermo compression bonding under high vacuum and mechanically, physically integrated.

The light-emitting device and the light-receiving devices are disposed on one face of the substrate, that is, disposed in a monolithic structure in which optical devices are optically connected face by face in the direction in which an optical path is perpendicular to the substrate or crosses the substrate. The optical devices other than the light-emitting device and the light-receiving devices are also formed flatly so that their optical paths are perpendicular to the substrate.

With the configuration, a laser beam (transmission beam) emitted from the front light-outgoing end of the light-emitting device sequentially passes through a diffraction light separating device, a λ/4 wave plate, and a dielectric plate having a converging focus lens to form an image on a recording face of a recording medium (optical recording medium). A reflected beam reflected by the recording face returns reversely along the optical path through which the transmission beam has traveled, the phase of the reflected beam is changed by the λ/4 wave plate, and the phase-changed reflected beam is separated into two primary diffracted beams in two directions. The primary diffracted beams fall on the light-receiving faces of the respective light-receiving devices. As a result, information can be reproduced and/or recorded by near-field recording.

An optical head according to the first embodiment can have small dimensions of, for example, 5×5×9 mm including the volume of wiring. The volume of the optical head can be reduced to about 1/10 of the conventional one. Thus, a very light optical head can be achieved.

In the optical head according to the first embodiment, the distance between the front light-outgoing end of the light-emitting device such as a semiconductor laser device to the surface facing a recording medium of an optical head is short, and the shorter optical path can be realized.

Description will be given hereinbelow with reference to the drawings.

Figure 2:
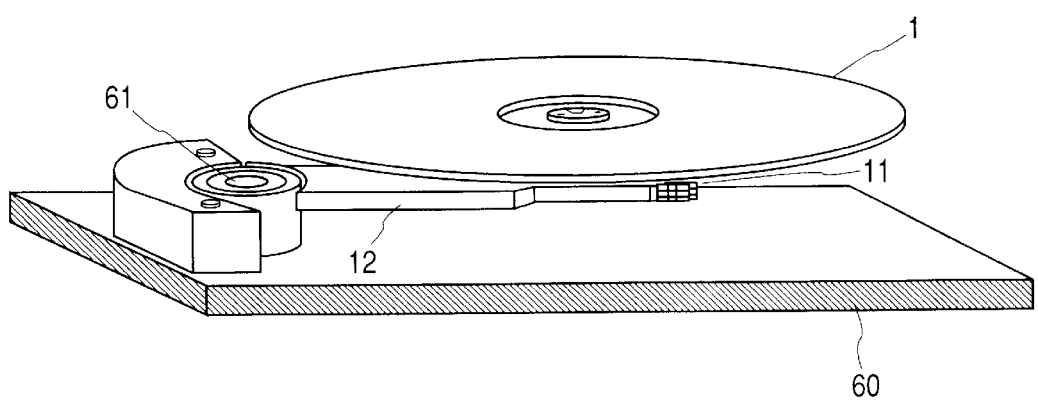
FIG. 2 is a perspective view showing the optical pickup mechanism of the DVD drive according to the first embodiment.

FIGS. 1 and 2 are perspective views each showing a part of an optical pickup mechanism of an optical information processor. As shown in FIG. 2, a feed motor 61 is disposed on the top face of a supporting plate 60, and a suspension arm 12 extends from the driving portion of the feed motor 61. At the tip of the suspension arm 12, as also shown in FIG. 1, an optical head 11 is attached. The optical head 11 moves along the under face of the recording medium (optical recording medium: optical disk) 1 by the driving of the feed motor (VCM: Voice Coil Motor) 61.

The optical head 11 uses either a structure in which the peripheral face of the optical head 11 is fixed to the suspension arm 12 as shown in FIG. 1 or a structure in which, since all electrodes are disposed on one of the faces of the optical head 11, the optical head 11 is fixed to the suspension arm 12 by a face mounting structure via the electrodes. In the face mounting structure, the mounting portion of the optical head 11 has a wiring board structure.

As will be described in detail hereinlater, in FIG. 1, a light-emitting device (semiconductor laser device) 16 is disposed in the center on the under face of the optical head 11 and light-receiving devices 17 are disposed on both sides of the light-emitting device 16. On a substrate 14 on which the light-emitting device 16 and the light-receiving device 17 are provided, a diffraction light separating device 19, a λ/4 wave plate 20, and a dielectric plate 22 having a converging focus lens (diffraction grating shape conversing focus lens 21) are sequentially, hierarchically integrated.

As a result, the laser beam (transmission beam) 13 emitted from the front light-outgoing end of the light emitting device 16 sequentially passes through the substrate 14, diffraction light separating device 19, λ/4 wave plate 20, diffraction-grating shaped converging focus lens 21, and dielectric plate 22 to form an image on the recording face of the optical disk 1. The reflected light 24 reflected by the recording face returns reversely along the optical path through which the transmission beam has passed. The phase of the reflected light 24 is changed by the λ/4 wave plate 20, and the phase-changed reflected beam is separated into two primary diffracted beams (reflected diffracted beam 24b) in two directions. The primary order diffracted beams fall on the light-receiving faces of the light-receiving devices 17 positioned on both sides of the light-emitting device 16.

In the configuration of the optical pickup, a single optical axis is used, and the optical devices (optical parts) are collected in one. Thus, the optical path of the transmission beam (laser beam) from the light-emitting device 16 to the optical disk 1 can be made extremely short, so that the optical pickup with improved efficiency for laser beam utilization can be constructed. By the focus lens 21, an image is formed as a near-field pattern from the transmission beam 13 onto the recording face of the optical disk 1. Consequently, high-density recording and reproduction can be performed by near-field recording.

Since the optical head 11 has the integrated structure, it is small and light, and high-speed recording and reproduction which cannot be realized by the conventional techniques can be realized.

According to the first embodiment, therefore, high-speed and high-density recording and reproduction can be carried out.

Figure 3:
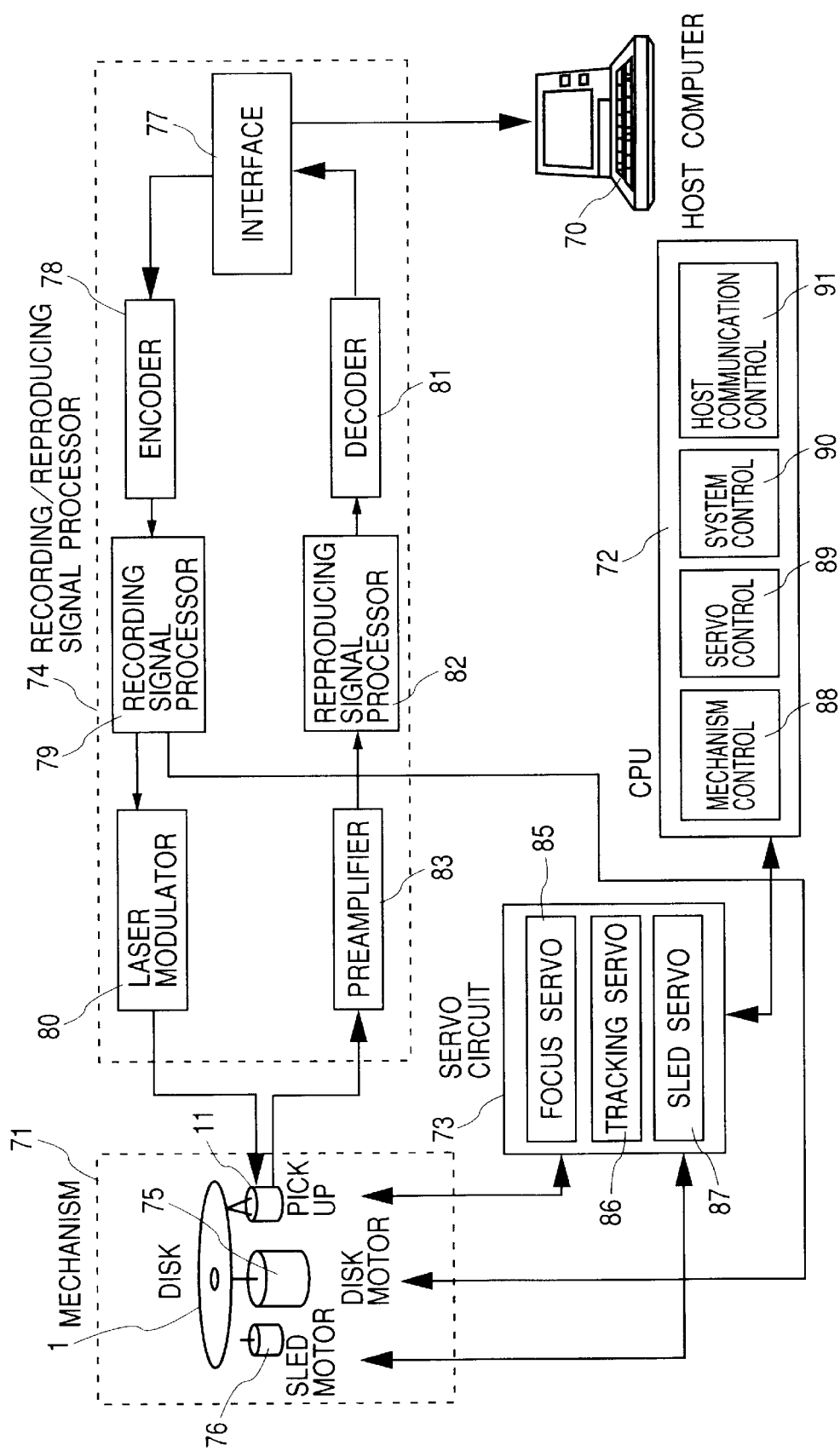
FIG. 3 is a block diagram showing the system configuration of the DVD drive according to the first embodiment.

The outline of the system of the optical information processor will be briefly described here with reference to FIG. 3.

The optical information processor has a host computer 70, a mechanism 71 including the optical pickup mechanism and the like, a microcomputer 72 and a servo circuit 73 for driving the mechanism 71, and a recording/reproduction signal processing circuit 74 for processing a signal by the optical pickup mechanism (pickup).

In the mechanism 71, the recording medium 1 is rotated by a disk motor 75. On the under face side of the recording medium 1, the optical head 11 as a pickup and a thread motor 76 are disposed.

The recording/reproduction signal processing circuit 74 has a recording signal processing circuit system and a reproduction signal processing circuit system.

The recording signal processing circuit system is constructed by an encoder circuit 78, a recording signal processing circuit 79, and a laser modulating circuit 80 which are sequentially connected to the host computer 70 via an interface circuit 77. An optical output of the light-emitting device (semiconductor laser device) 16 of the optical head 11 is controlled by the laser modulating circuit 80.

The reproduction signal processing circuit system is constructed by a decoder circuit 81, a reproduction signal processing circuit 82, and a preamplifier circuit 83 which are sequentially connected to the host computer 70 via the interface circuit 77. The preamplifier circuit 83 performs waveform equalization and an amplifying process on a read signal from the optical disk 1 output from the light-receiving device 17 of the optical head 11, and outputs the resultant to the reproduction signal processing circuit 82. By a PLL circuit in the reproduction signal processing circuit 82, a clock and data are reproduced and a demodulating process, error detection, and error correction are performed, and a reproduction signal is output to the decoder circuit 81. The decoder circuit 81 selects a designated output line from a plurality of output lines and outputs it to the host computer 70 via the recording signal processing circuit 79.

The servo circuit 73 has a focusing servo 85, a tracking servo 86, and a thread servo 87. The servo circuit 73 controls the optical pickup mechanism including the optical head 11 and the thread motor 76. The disk motor 75 is connected to a disk servo connected to the recording signal processing circuit 79 and the reproduction signal processing circuit 82 and is rotated by the disk servo.

The microcomputer 72 has control units of a mechanism control 88, a servo control 89, a system control 90, a host communication control 91, and the like, and is connected to the recording/reproduction signal processing circuit 74 and the servo circuit 73.

With such a system configuration, information is recorded/reproduced to/from the optical disk 1.

Figure 4:
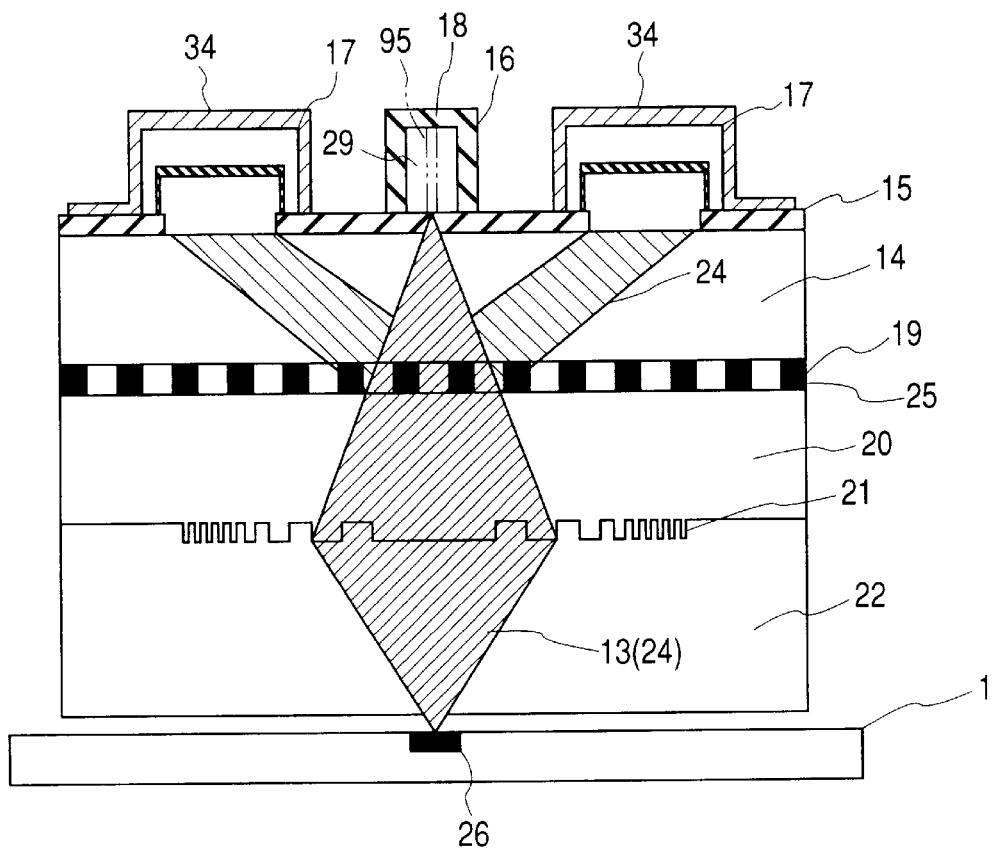
FIG. 4 is a cross section in a direction of arrangement of a light-emitting device and a light-receiving device of an optical head of the optical pickup mechanism in the DVD drive according to the first embodiment.
Figure 5:
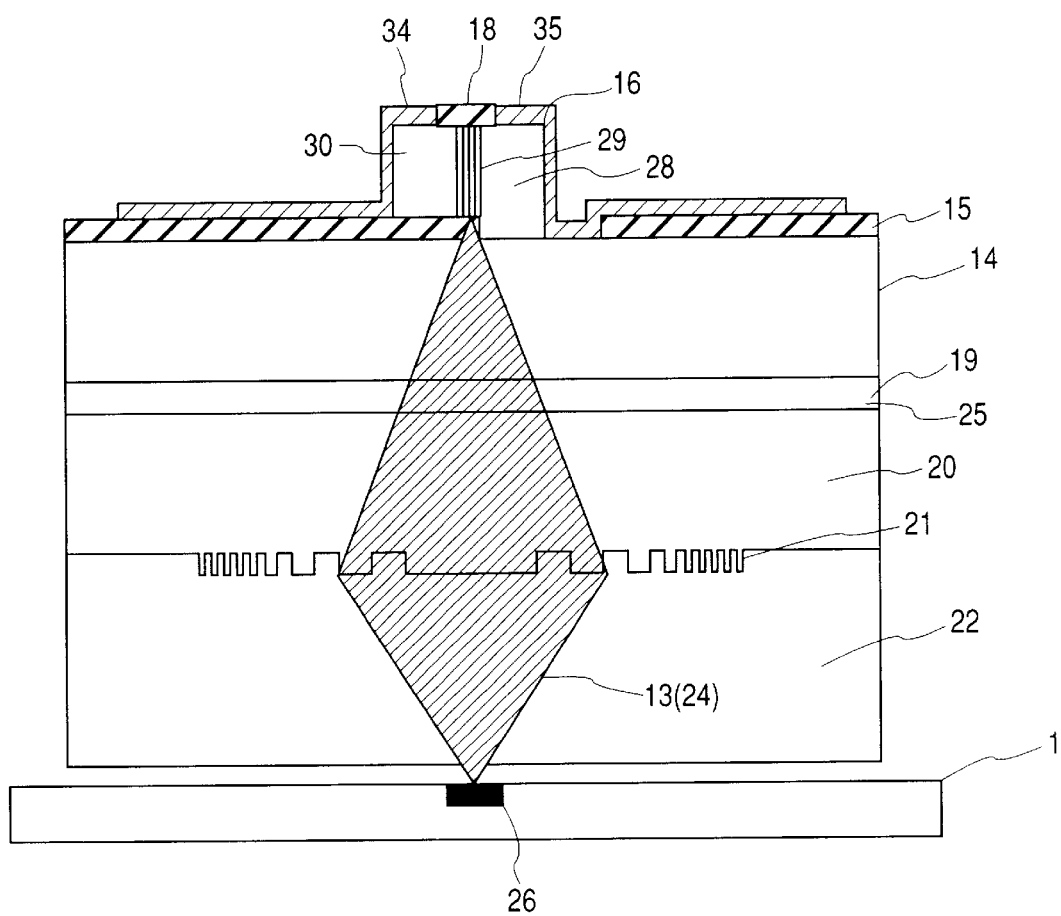
FIG. 5 is a cross section in a direction perpendicular to the arrangement direction of the light-emitting device and the light-receiving device of the optical head.
Figure 6:
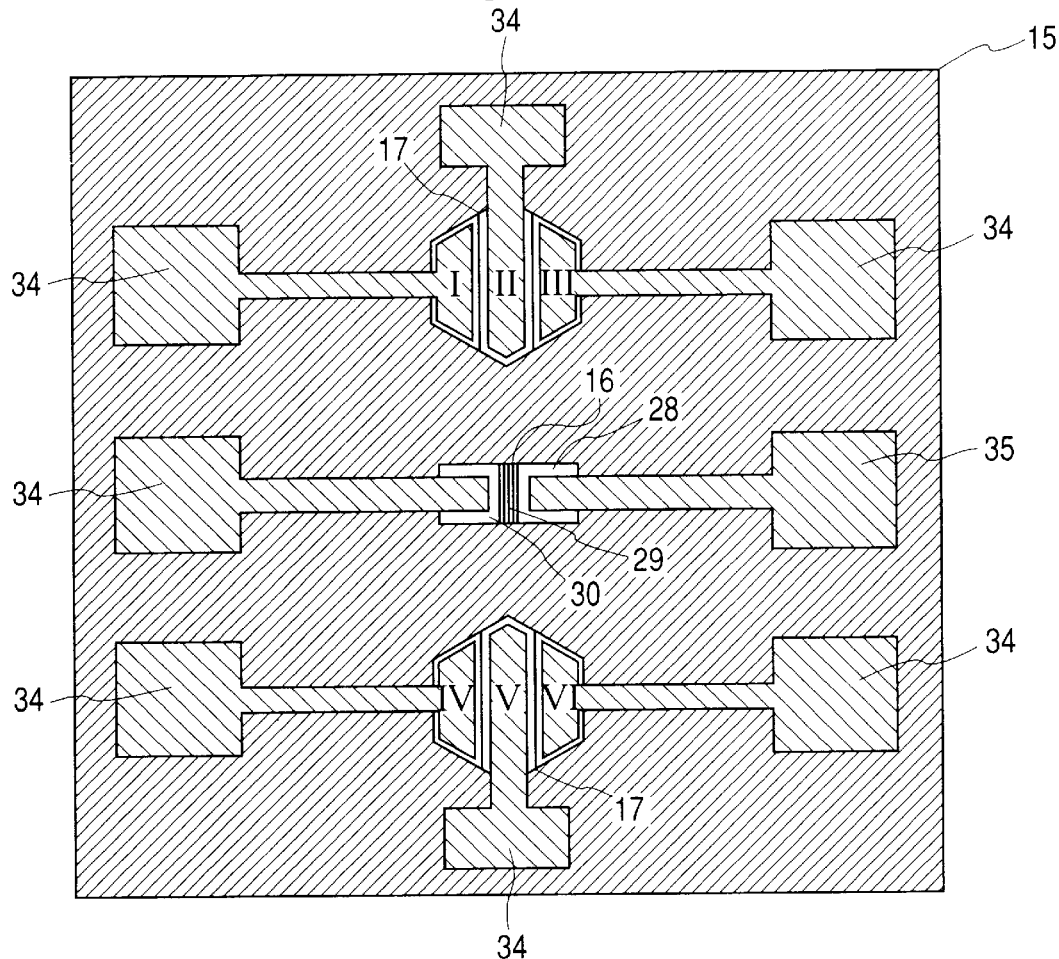
FIG. 6 is a schematic plan view of the optical head.

The optical head 11 of the first embodiment has a configuration as shown in FIGS. 4 to 6. FIG. 4 is a cross section taken along the direction of arrangement of the light-emitting device and the light-receiving device. FIG. 5 is a cross section taken along the direction orthogonal to the cross section of FIG. 4. FIG. 6 is a schematic plan view showing an arrangement state of electrodes of the optical disk 1.

In the first description, the case where the light-emitting device 16 and the light-receiving device 17 are made of a nitride semiconductor material will be described. The details of the configuration of the light-emitting device 16 and the light-receiving device 17 will be described hereinlater.

First, as the substrate 14 made by single crystal which becomes transparent in a wavelength region from an ultraviolet region to a visible region, for example, the sapphire substrate 14 is used. On the sapphire substrate 14, the light-emitting device (semiconductor laser device) 16 and the light-receiving device 17 are provided. The substrate face of the sapphire substrate is set as a (0001) orientation C face. An insulating film mask 15 having a predetermined pattern is formed on one face of the substrate 14 and, by using a selective growth technique, a semiconductor layer for forming the light-emitting device 16 and the light-receiving device 17 is provided.

The light-receiving device 17 and the light-emitting device 16 may be made of different materials and have different structures, or may be made of the same material simultaneously. In the first embodiment, they are made of the same material.

The insulating film mask 15 also serves as a high-reflection film having a DBR (Distributed Bragg Reflector) structure of two dielectric films having different refractive indices. For example, as materials, a combination of $SiO_2$ (having a refractive index of 1.45) and SiN (having a refractive index of 1.95), a combination of $Al_2O_3$ (having a refractive index of 1.6) and AlN (having a refractive index of 2.1), or the like is used. By adjusting the periodicity of the combination, the reflectance of a laser beam can be controlled.

The light-generating device is constructed in a form that an active layer (light-emitting activate layer) is formed perpendicular to the substrate 14 and the insulating film mask 15 by following formation of a semiconductor layer and an optical waveguide sandwiches the active layer in the lateral direction. As a reflecting mirror under the perpendicular active layer, the insulating film mask 15 is used, and a reflection film (high reflection film) 18 made by a dielectric insulating film is newly formed on the upper side.

The high reflectance film 18 is fabricated with a configuration similar to that of the insulating film mask 15. Consequently, the light-emitting device 16 can construct a semiconductor laser device having a resonator 95 perpendicular to the substrate and which emits the laser beam 13 in the direction perpendicular to the substrate. By setting the reflectance of the high reflection film 18 as a reflecting mirror to be higher than that of the insulating film mask 15, an outgoing light output of the semiconductor laser can be taken to the under face (other face) side of the substrate.

The insulating film mask 15 side serves as the front light-outgoing end of the resonator 95, and the laser beam is emitted in the in-plane direction perpendicular to the substrate face.

The light-receiving device 17 can be formed of the same material as that of the light-emitting device by distinguishing the pattern width of the insulating film mask for the light-receiving device and that for the light-emitting device from each other by the selective growth technique. In this case, by single crystal growth, a device in which the light-emitting device 16 and the light-receiving device 17 are monolithic integrated is obtained.

On the other face of the substrate 14, a transparent plate 25 made of a dielectric material, for example, $LiNbO_3$ is bonded or adhered, and the diffraction light separating device 19 having diffraction grating-shaped areas having different refractive indices formed by impurity diffusion, ion implantation, or the like is formed. The plate 25 made of $LiNbO_3$ in which the diffraction light separating device 19 is formed may be bonded or adhered to the substrate 14.

The diffraction grating can separate incident light into a 0 order ray and a primary ray (reflected diffraction light 24b) and functions as the diffraction light separating device 19.

On the diffraction light separating device 19, the λ/4 wave plate (quarter-wave plate) 20 made of quartz, a transparent dielectric film, or transparent plastic resin is bonded or adhered. When the wavelength of the laser beam 13 is λ, the phase of the laser beam 13 and that of the reflected light are canceled out by the λ/4 wave plate 20.

Further, the converging focus lens (diffraction-grating-shaped conversing focus lens) 21 having the action of converging the diffraction light by forming a circumferential groove in a diffraction grating shape is formed on one face of the dielectric plate 22. The dielectric plate 22 is made of, for example, a dielectric material such as $LiNbO_3$.

The parts of the substrate 14, diffraction light separating device 19 (plate 25), λ/4 wave plate 20, and dielectric plate 22 are bonded by an intermolecular force of thermo compression bonding under high vacuum of about $10^{-9}$ to $10^{-10}$ Torr and are mechanically, physically integrated. Since the bonding is performed by the intermolecular force, an optical loss in the connection interface is small.

The distance from the front light-outgoing end of the semiconductor laser device 16 to the surface of the dielectric plate 22 facing the recording medium of the optical head becomes shorter, so that the shortened optical path can be realized.

In the first embodiment, the optical head 11 is provided which has the configuration that, on one side of the substrate 14, the light-emitting device (semiconductor laser device) 16 for emitting the transmission beam 13 and the plurality of light-receiving devices 17 for receiving the reflected beams 14 passed through the substrate 14 and the like are disposed, and the other optical devices (diffraction light separating device 19, λ/4 wave plate 20, and diffraction grating shaped converging focus lens 21) are disposed so as to be adjusted to the optical paths 10 of the transmission beam 13 and the reflected beam 24.

With the configuration, the optical head 11 can form a near field pattern in a position on the outside of the dielectric plate 22 but very close to the dielectric plate 22. It is a precondition that the refractive index (n) of the dielectric plate 22 is higher than at least the refractive index 1 of air. By satisfying the precondition, when the numerical aperture of a diffraction grating lens is NA, the size of a near field image to be formed is proportional to λ/(nNA). The image can be reduced by an amount corresponding to the refractive index (n) of the dielectric substrate. As a result, recording and reproduction can be realized by the near field. The near field image is formed in a position apart from the surface of the dielectric plate 22 in a range from a few nm to hundreds nm.

The integrated face type optical head 11 of the first embodiment controls the transmission beam (laser beam) 13 from the semiconductor laser device 16, reads a recording mark (memory) on a recording medium, and receives the signal from the light-receiving device 17. The control and reception are performed as follows. The transmission beam 13 emitted from the semiconductor laser device 16 as a light-emitting device passes through the substrate 14, diffraction light separating device 19, and λ/4 wave plate 20 and is converged in the dielectric plate 22 by the diffraction grating shape converging focus lens 21, and an image is formed in an outside position apart from the dielectric plate 22 by the range from tens to hundreds μm. That is, the transmission beam 13 is converged by the diffraction grating shaped converging focus lens 21 to form an image on a memory 26 in the recording medium 1 and is reflected with the signal of the memory 26. The reflected beam 24 passes through the dielectric plate 22, diffracted and converged by the diffraction grating shaped converging focus lens 22 and is separated into a 0 order ray and a primary ray by the diffraction light separating device 19. The reflected diffraction beams 24b are received by the light-receiving devices 17. The signal of the reflected diffraction beam 24b is used as a signal for correcting a focusing error or a tracking error. The diffraction light separating device 19 does not play a role for the laser beam (transmission beam 13) emitted from the semiconductor laser device 16 but plays a role of separating the reflection beam 24 of the laser beam and guiding the primary diffracted beam to the light-receiving face (light-receiving area) in the light-receiving device 17.

The details of the configuration of the light-emitting device and the light-receiving device will be described hereinbelow by using FIGS. 4 to 10.

Figure 7:
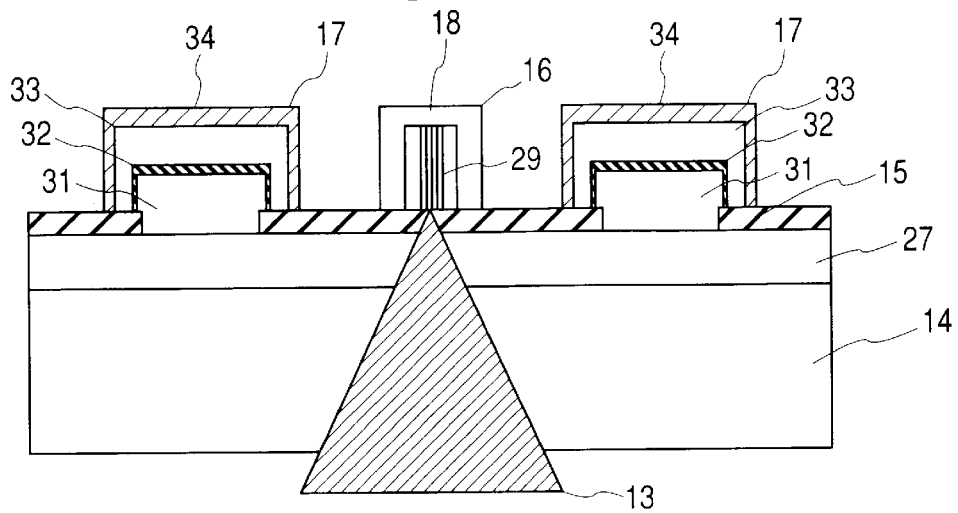
FIG. 7 is a cross section showing a substrate on which the light-emitting device and the light-receiving device are formed.
Figure 8:
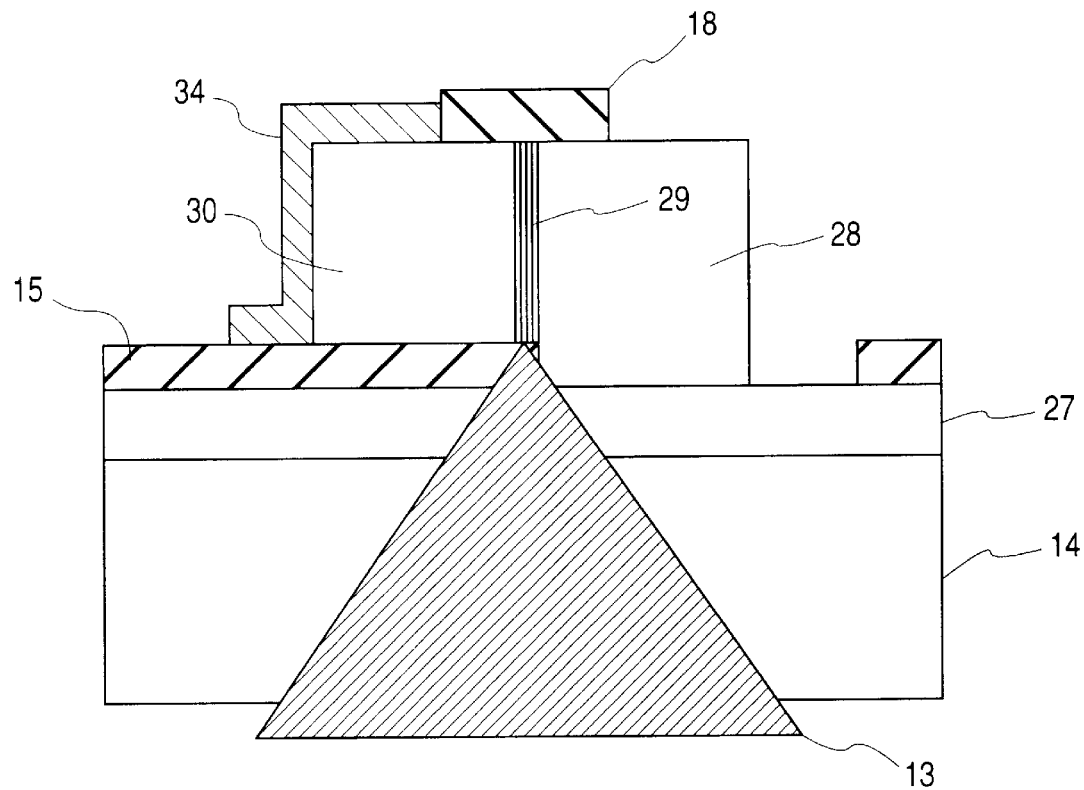
FIG. 8 is a cross section showing the portion of the light-emitting device.
Figure 9:
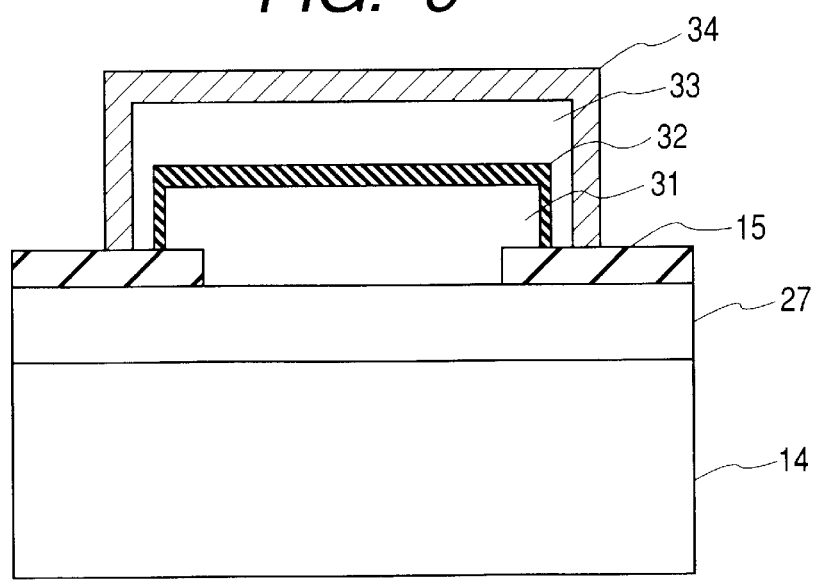
FIG. 9 is a cross section showing the portion of the light-receiving device.

As shown in FIGS. 7 to 9, on one face of the substrate 14 made by a transparent sapphire single crystal, the light-emitting device (semiconductor laser device) 16 and the light-receiving device 17 are formed. For example, in a blue-violet laser made of a nitride semiconductor material, a sapphire substrate with a (0001) C face is used. On the sapphire substrate, first, an n-type GaN optical waveguide layer 27 is crystal-grown on the entire surface by metalorganic chemical vapor deposition (MOCVD). In FIGS. 4 and 5, the optical waveguide layer 27 is not formed and it is also possible not to form the optical waveguide layer 27.

Subsequently, the insulating film mask 15 having the DBR structure consisting of two dielectric films of different refractive indices is formed. The insulating film mask 15 is made of a combination of $SiO_2$ (having a refractive index of 1.45) and AlN (having a refractive index of 1.95), a combination of $Al_2O_3$ (having a refractive index of 1.6) and AlN (having a refractive index of 2.1), or the like.

Figure 10:
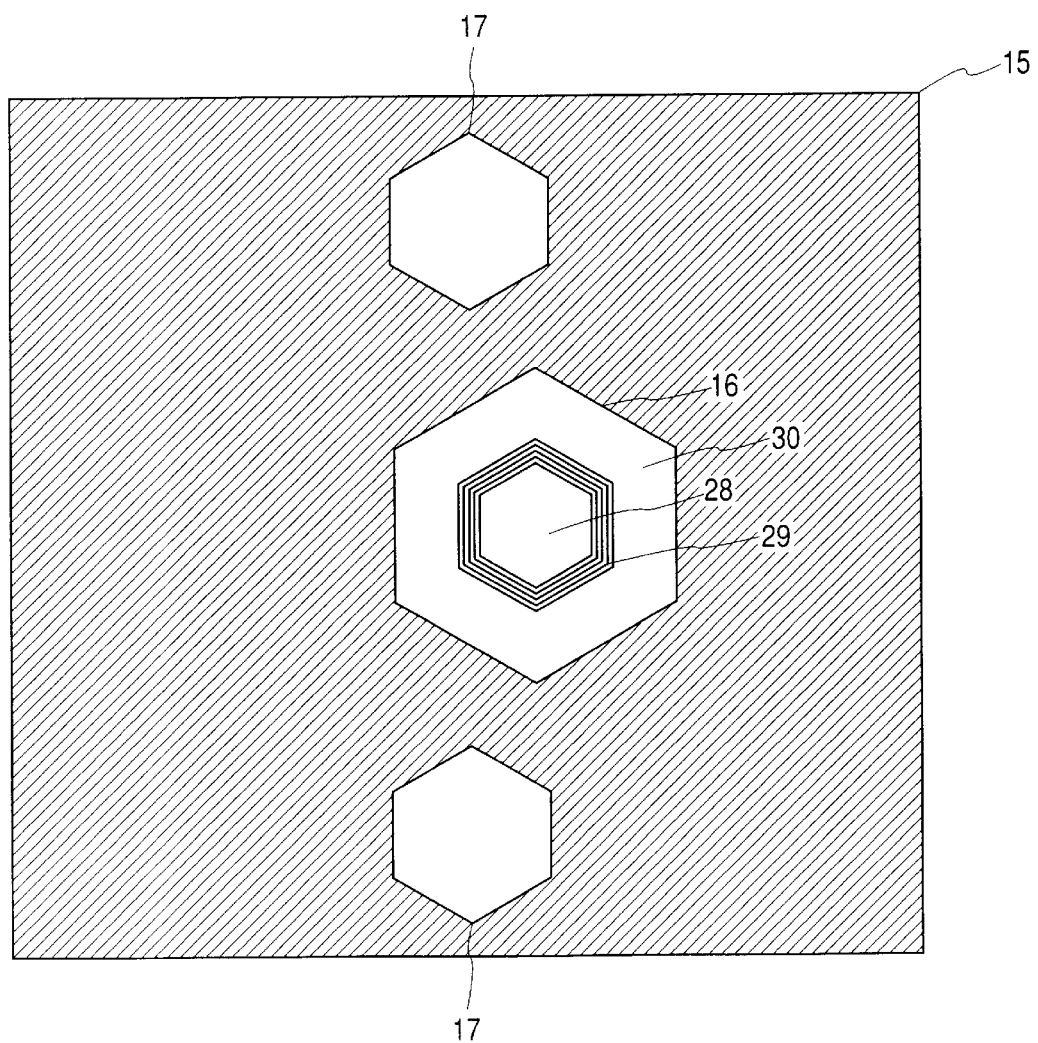
FIG. 10 is a plan view showing a pattern of a selective growth layer for forming the light-emitting device and the light-receiving device formed on the substrate in the first embodiment.

In the insulating film mask 15, a narrow hexagon-shaped window pattern is provided in the area of the light-emitting device 16 and a relatively wide hexagon-shaped window pattern is provided in the area of each of the light-receiving devices 17 (refer to FIG. 10).

After that, the insulating film mask 15 is used as a mask for selective growth, and a crystal is selectively grown by MOVPE. For the light-emitting device, an n-type GaN/AlGaN optical waveguide layer 28, a GaInN/GaN/AlGaN strained multi-quantum-well structure active layer 29, and a p-type GaN/AlGaN optical waveguide layer 30 are sequentially epitaxially selectively grown. For the light-receiving device, an n-type GaN/AlGaN optical waveguide layer 31, a GaInN/GaN/AlGaN strained multi-quantum-well structure light-receiving layer 32, and a p-type GaN/AlGaN optical waveguide layer 33 are sequentially epitaxially selective grown.

When the light-emitting device 16 and the light-receiving device 17 are provided monolithically by a single crystal growth, the layers 31, 32, and 33 of the light-receiving device correspond to the layers 28, 29, and 30 of the light-emitting device, respectively.

Although the light-emitting device 16 has a sectional shape as that of the light-receiving device in the beginning, it comes to have the configuration as shown in FIG. 7 by lithography and dry process. In the top view, when the horizontal portion of the active layer 29 on the optical waveguide layer 28 is removed by lithography and dry process, as shown in FIG. 10, the light-emitting device 16 is formed so that the optical waveguide layer and the active layer are neighboring to each other in a sectionally cut view. At this time, the light-receiving device 17 is covered with a mask so as not to be processed.

Subsequently, the light-emitting device 16 is further processed by again using lithography and dry process so that, as shown in FIG. 6, the active layer 29 remains only on one side face of the hexagon. The stripe width of the active layer 29 when seen from overhead is in a range from 1 µm to 5 µm. It is necessary to satisfy the condition that the fundamental lateral mode is stable and light can be propagated and guided. It is important to form a complete-round beam shape in the fundamental lateral mode by setting the aspect ratio to a value closet to 1 as much as possible. By designing the active layer in the range of the stripe width, the complete-round laser beam shape can be realized.

The light-receiving device 17 is processed in a manner similar to the light-emitting device 16, divided into three portions as shown in FIG. 6, which are used as divided light-receiving areas for divided-reception control for correcting a focusing error and a tracking error.

After that, in the light-emitting device 16, at an upper end of the active layer 29 formed on a side face of the optical waveguide layer 28, the reflection film (high reflection film) 18 having the dielectric multilayer film DBR structure is provided. The reflection film 18 and the insulating film mask 15 form a reflecting mirror.

Since the optical waveguide layer 28 is formed in a regular hexagonal prism shape, the active layer 29 grown on a side face can be formed perpendicular to the substrate face, and the perpendicular resonator 95 (refer to FIG. 4) can be constructed by the reflecting mirror.

The high reflection film 18 is formed by a fabricating method similar to that of the insulating film mask 15 as a component of the high reflection film and is made of a combination of $SiO_2$ (having a refractive index of 1.45) and SiN (having a refractive index of 1.95), a combination of $Al_2O_3$ (having a refractive index of 1.6) and AlN (having a refractive index of 2.1), or the like. By setting the reflectance of the high reflection film 18 to be higher than that of the insulating film mask 15, the most part of the oscillated laser beam can be emitted as outgoing light (transmission beam 13) to the in-plane direction of the substrate 14.

As shown in FIG. 4, the high reflection film 18 is provided not only on the upper end side of the active layer (resonator 95) but also on both side faces. By provided the dielectric film made of a material having a refractive index lower than that of the active layer and higher than that of air on both sides of the active layer, the condition limited to the stripe width of the active layer by which the fundamental lateral mode is obtained is lessened, and the fundamental lateral mode can be stably controlled in the wider stripe width.

Further, by covering the active layer with the high reflection film 18, the leakage ratio of the laser beam from the active layer can be lowered. The leaked laser beam is set to be used for optical pumping as photon recycling, thereby enabling the oscillation efficiency of the laser beam to be increased.

The important point in the relation between the light-emitting device 16 and the light-receiving device 17 will be described hereinbelow. The light-receiving layer 32 has to have band gap energy larger than that of the laser beam so that the reflected beam 24 of the transmission beam 13 which has reached the recording medium 1 and returned is absorbed by the light-receiving layer 32 in the light-receiving device. This is achieved by the conditions at the time of crystal growth.

Specifically, at the time of the selective growth, conditions are set so that growth speed is high on the upper side perpendicular to the substrate face and is relatively low on the side in the horizontal direction. By the setting, the quantum well layer in the active layer 29 in the light-emitting device 16 is relatively thin and the differential between the two quantum level energies is high. Since the light-receiving layer 32 in the light-receiving device 17 is the relatively-thick quantum well layer, the differential between the two quantum level energies is low, so that an effect of absorbing a laser beam of higher energy can be produced. Consequently, even when the light-emitting device 16 and the light-receiving device 17 are formed simultaneously by using the same material, the laser beam is absorbed and the signal which can be used for optical control can be obtained.

FIGS. 8 and 9 are enlarged views showing the details of the light-emitting device 16 and the light-receiving device 17, respectively. In FIG. 8, the reflection film (reflecting mirror) 18 of the vertical resonator is formed and, after that, a p-side electrode (anode electrode) 34 is fabricated so as to be in contact with the p-type optical waveguide layer 30 by a lift-off method. An n-side electrode (cathode electrode) 35 is, although not shown, provided in contact with the layer 27 (or layer 14) by the lift-off method (refer to FIG. 5). The light-receiving area in the light-receiving device in FIG. 9 is face-type light reception by a face-type light-receiving layer.

In the case of forming the light-emitting device 16 and the light-receiving device 17 on one face of the substrate 14, as shown in FIGS. 10 and 6, it is important to make setting in consideration of the pattern of the insulating film mask 15 for selective growth so that the active layer 29 remained on one of the side faces of the regular hexagonal prism and the light-receiving device 17 are arranged on a straight line.

Figure 11:
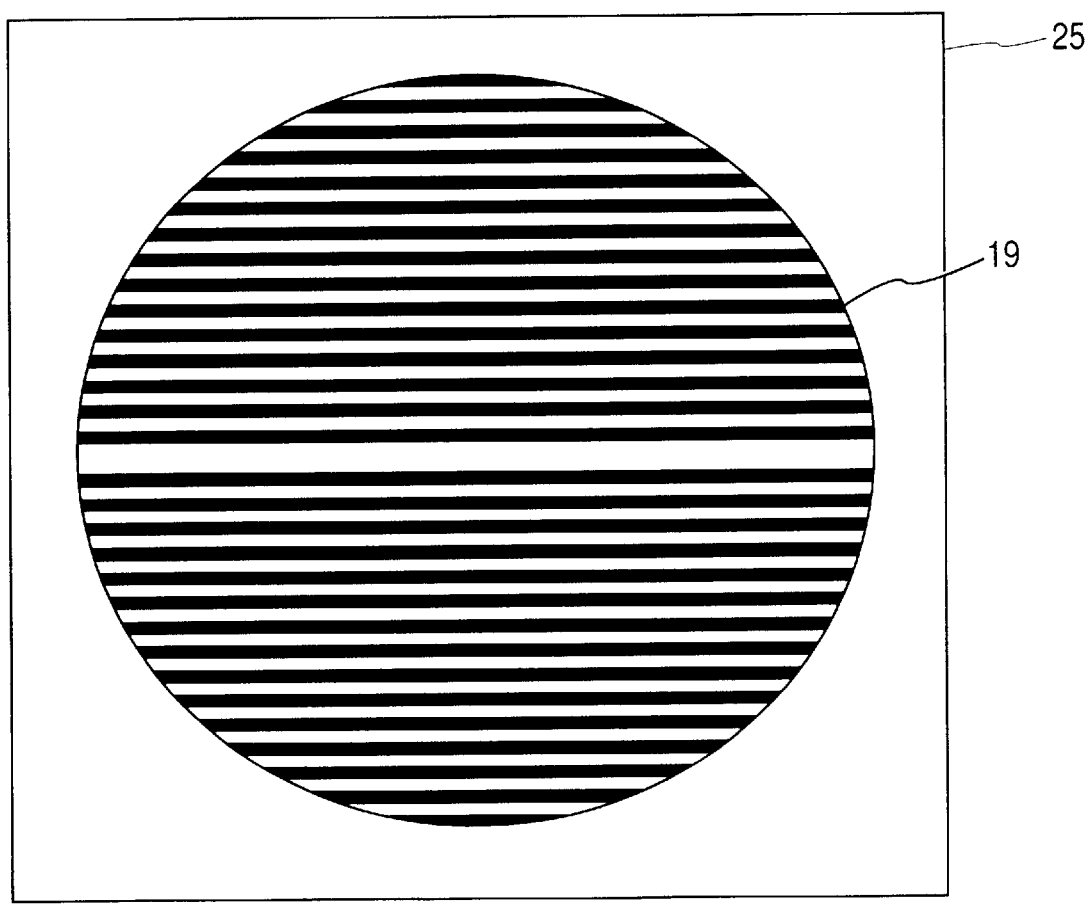
FIG. 11 is a plan view showing a diffraction light separating device in the optical head according to the first embodiment.

In order to division-detect diffraction of the reflected beam 24 as a light reception signal, the diffraction light separating device 19 is provided on the back (other face) of the substrate 14. The diffraction light separating device 19 is formed, as shown in FIG. 11, by providing a diffraction grating in the plate 25 made of a transparent dielectric material. The diffraction grating in a circular shape is provided by setting its center to the center portion of the active layer 29 in the light-emitting device 16. The diffraction grating pattern is a parallel pattern for generating a 0 order beam and +− primary diffraction beams.

Consequently, the diffraction light separating device 19 does not play a role for the transmission beam 13 emitted from the light-emitting device 16 but plays a role of separating the primary diffracted beam from the reflection beam 24 reflected by the optical disk 1 and guiding the primary diffracted beam to the light-receiving device 17. In order to make separation of the diffracted beam more effectively, it is effective to provide areas of different refractive indices periodically in a crystal material having high anisotropy. By periodically providing areas of different refractive indices in a diffraction grating shape, the diffraction light separating device 19 can be formed on the flat crystal substrate. Further, the diffraction light separating device 19 formed in the diffraction grating can diffract the reflected beam 24 into primary diffracted beams to the two light-receiving devices 17 so as to be processed. By separating the primary diffracted beams of the reflected beam 24 and making the separated primary diffracted beams enter the light-receiving devices provided on both sides of the laser device, signal processes of focal point and tracking correction can be performed.

In fabrication of the diffraction light separating device 19, a dielectric material is used as the crystal material having high anisotropy. $LiNbO_3$ is common but a material such as MgO may be added to increase the anisotropy. Other dielectric materials such as $LiTaO_3$, $Al_2O_3$, and ZnO may be also used as long as the material achieves the above-described effect.

Since the first embodiment employs the configuration that the light-receiving devices 17 are disposed on both sides of the light-emitting device 16, the diffraction light separating device 19 separates the reflected beam 24 into two directions. In the case where the light-receiving devices 17 are not disposed on the same line including the light-emitting device 16 but are disposed around the light-emitting device 16 at angles from the light-emitting device 16, it is sufficient to adjust the pattern of the diffraction grating constructing the diffraction light separating device 19 so as to separate the reflected beam 24 to the light-receiving devices 17.

Figure 12:
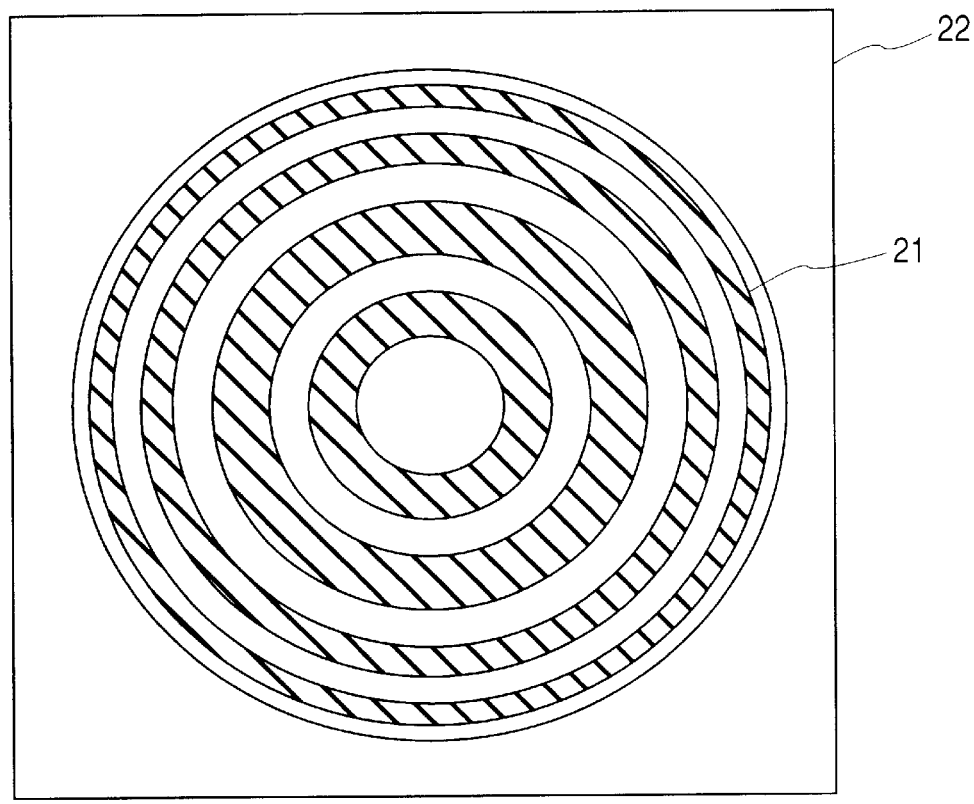
FIG. 12 is a plan view showing a diffraction grating type converging focus lens in the optical head according to the first embodiment.

In On one face side of the dielectric plate 22, the diffraction grating is provided and the conversing focus lens 21 in the diffraction grating shape is formed. The focus lens 21 has the function of converging the transmission beam 13 from the light-emitting device 16 to form an image on the optical disk 1. The converging focus lens 21 in the diffraction grating shape is fabricated by periodically providing areas having different refractive indices in the transparent crystal material having high anisotropy. The material is the dielectric used for forming the deflection light separating device. As shown in FIG. 12, the focus lens 21 is formed by a circular diffraction grating and captures the whole laser beam distribution in consideration of the diffusion angles of the laser beam emitted from the vertical resonator. With the configuration, the laser beam can be converged or diffracted and separated symmetrically with respect to the optical axis of the laser beam (transmission beam) 13.

Each of the diffraction light separating device 19 and the converging focal lens 21 having the diffraction grating shape is formed by the diffraction grating. The diffraction grating is constructed by at least two kinds of areas having different refractive indices and is formed by, desirably, crystal having high anisotropy. For example, the diffraction grating constructed by the two kinds of areas can be formed by impurity diffusion or ion implantation. Such a fabricating method produces an accurate pattern and an actual profit because of low fabrication cost.

The light-receiving devices 17 are, as shown in FIG. 6, disposed on both sides of the light-emitting device 16 and is divided into three portions. The light-receiving device 17 is used to control the focal point and tracking correction by using the reflected beam 24 as a signal beam. The reflected beam 24 is separated by the diffraction light separating device 19 into reflected diffraction beams 24B which are detected by the plurality of light receiving devices.

Signals at the plurality of light-receiving devices are used as a sum signal which is used for detecting a focus error signal and a tracking signal. A current-voltage amplifier for converting a current output from the light-receiving device into a voltage is provided. Through the amplifier, each signal is amplified and an amplified signal is output. By right and left difference signals, a focus error signal and a tracking signal are obtained.

That is, when signals from the optical disk 1 are detected by the light-receiving devices 17 on both sides of the light-emitting device 16, ± primary diffraction beams diffracted via the diffraction light separating device are efficiently detected.

Further, in order to use the difference signal by employing the focus error signal detection as spot size detection in a signal detecting method, the light-receiving device is divided into three areas. As shown in FIG. 12, signals used for detection are based on weak current outputs received in areas I, II, III, IV, V, and VI of the light-receiving devices. The weak currents for signal detection are made correspond to the areas of the light-receiving devices and set as PDI, PDII, PDIII, PDIV, PDV, and PDVI, respectively.

Out of the signals, for the focus error signal detection, signal currents divided into two signals of a sum signal PD(1) of PDI+PDIII+PDV and a sum signal PD(2) of PDII+PDIV+PDVI are set. By using a difference signal between PD(1) and PD(2) as a reference, a correction signal for a focus error on the optical disk is obtained. In practice, the current-voltage amplifier for converting a weak current from the light-receiving device into a voltage and a current source are prepared as circuits. The current signals of PD(1) and PD(2) are converted into voltages. The signals are dealt as outputs of the amplifier. In the case where a focus error signal F is expressed as F=PD(1)−PD(2), when F=0, the focusing servo achieves focus. When F>0, it is determined that the optical disk is positioned farther to the optical head as compared with the case where focus is achieved. When F<0, it is determined that the optical head is closer to the optical head as compared with case where focus is achieved. With the configuration, the focus error signal detection and the focus servo control can be realized. The sump signal of the voltage signals PD(1) and PD(2) of the light-receiving device used for detecting the focus error signal can be used as a high frequency signal.

On the other hand, for the tracking error signal detection, a sum signal PD(3) of PDI+PDIV and a sum signal PD(4) of PDIII+PDVI are used. In practice, each of the current signals PD(3) and PD(4) is converted to a voltage by a current-voltage amplifier, the voltage is amplified by an amplifier, and an output of the amplifier is used. When a tracking error signal T is expressed by T=PD(3)−PD(4), the tracking servo determines as follows. When T=0, a laser beam is on a track of an optical disk. When T>0 or T<0, the laser beam is deviated to the right or left from a track of the optical disk. With the configuration, the tracking error signal detection and the tracking servo control can be realized.

As described above, the optical information processor can be constructed by using the optical head 11 of the first embodiment, which achieves the focus servo and tracking servo control by converging the laser beam from the blue-violet semiconductor laser device as the light-emitting device 16 to the recording medium memory in an optical disk to form an image at the focal point, diffracting the reflected beam having the written/read information of the memory into separated signal beams, and detecting the separated signal beams by the light-receiving devices.

According to the first embodiment, the following effects are produced.

(1) The transmission beam 13 emitted from the front light-outgoing end of the semiconductor laser device 16 sequentially passes through the substrate 14, diffraction light separating device 19, λ/4 wave plate 20, and dielectric plate 22 having the converging focus lens 21 having the diffraction grating shape to form an image on the recording face of the recording medium (optical recording medium) 1. The reflected beam 24 reflected by the recording face goes back through the optical path through which the transmission beam 13 has passed. The phase of the reflected beam 24 is changed by the λ/4 wave plate 20, and the phase-changed reflected beam is separated into two primary diffracted beams in two directions. The primary diffracted beams fall on the light-receiving faces of the respective light-receiving devices 17. Thus, information can be reproduced and/or recorded by near-field recording.

(2) The semiconductor laser device 16 of the first embodiment has the vertical resonator structure, can couple the gain areas in the direction of guiding and propagating a laser beam, and the gain can be continuously obtained until the reflection film (reflecting mirror). Consequently, operation of a higher output than a conventional face-emitting type semiconductor laser device can be performed. In the first embodiment, while assuring the complete-round fundamental lateral mode, light is oscillated at 380 to 430 nm in a wavelength region from an ultraviolet region to the blue-violet region, and an optical output of 20 to 50 mW can be achieved.

(3) The substrate 14 having the semiconductor laser device 16 and the light-receiving device 17, diffraction light separating device 19, λ/4 wave plate 20, and dielectric plate 22 having the converging focus lens 21 in the diffraction grating shape are sequentially hierarchically integrated, and mechanically, physically integrated. Thus, the optical head having the functionality which cannot be realized by the conventional techniques and realizing small size and light weight can be provided. For example, in the case of discrete optical system in the conventional technique, the dimensions of the optical size are, for example, about 60×40×10 mm. In contrast, in the technique of the invention, the dimensions even including the volume of the wiring can be reduced to 5×5×9 mm. The volume can be reduced to about 1/100 of the conventional one, and extremely light weight can be also achieved. In the structure where the optical head 11 is attached to the suspension arm 12 of the optical pickup mechanism, therefore, the suspension arm can be swung at high speed like the head of a hard disk, and recording and reproduction can be performed at high speed also in the optical information processor (DVD drive).

(4) Since the optical devices are integrated mechanically and physically in the optical head 11, the optical path can be made extremely short, so that efficiency for utilization of the laser beam (transmission beam) 13 can be improved remarkably. By the reduction in the optical path, also in the light-receiving device area divided, the sensitivity can be largely improved. An access time of focus/tracking correction and reading (reproduction) with respect to the recording mark 26 in the optical recording medium can be shortened, so that the higher-speed optical information process can be achieved.

(5) Since the optical devices are integrated mechanically and physically in the optical head 11, no air exists in the optical paths of the transmission beam 13 and the reflected beam 24, so that the optical loss can be suppressed very much. Thus, improved transmission beam output of the semiconductor laser device 16 and increased light-receiving sensitivity of the light-receiving device 17 can be achieved. Particularly, in the structure that the substrate 14, diffraction light separating device 19, λ/4 wave plate 20, and dielectric plate 22 constructing the optical head 11 are bonded by an intermolecular force, an optical loss is smaller, and improved transmission beam output and increased light-receiving sensitivity of the light-receiving device are achieved, thereby increasing the performance of the optical information processor.

(6) By the above-described (4) and (5), in the optical pickup mechanism in the optical information processor, by the shortened optical path and reduced optical loss, the laser beam output can be lowered. Thus, power consumption for laser oscillation can be lowered.

(7) Since the near field recording can be performed, higher-density recording of the optical information processor can be achieved.

(8) As each of the converging focus lens 21 having the diffraction grating shape and the diffraction light separating device 19 is formed by the diffraction grating having two kinds of areas formed by impurity diffusion or ion implantation, the devices can be easily fabricated with high precision, and lower cost of the optical head 11 can be achieved.

(9) The semiconductor laser device 16 and the light-receiving device 17 can be formed monolithically on the substrate 14 by the semiconductor manufacturing technique. Consequently, they can be fabricated with high precision at low cost, and while minimizing the number of crystal growth times, the devices having the light-emitting and light-receiving functions can be constructed. Thus, lower cost of the optical head 11 can be achieved.

(10) Since the reflectance of the insulating film mask 15 constructing the reflection film of the front light-outgoing end of the semiconductor laser device 16 is lower than that of the reflection film 18 at the other end, improved optical output of the transmission beam 13 can be achieved. The insulating film mask 15 at the front light-outgoing end is formed by an insulating mask used at the time of forming the semiconductor crystal by selective growth to form the semiconductor laser device 16. Thus, reduction in the manufacturing cost can be achieved.

(11) The semiconductor laser device 16 has a multi-quantum-well structure or a strained multi-quantum-well structure obtained by introducing grating distortion into a quantum-well layer, a higher output of the laser beam can be achieved.

(12) The light-receiving area of the light-receiving device 17 has a face-type light-receiving area configuration. Consequently, a reflected beam can be efficiently detected as a reception signal. Thus, on the basis of detection signals of the light-receiving devices, focus correction, tracking correction and, further, optical output control of the transmission beam can be carried out, and the optical information processor having high controllability can be provided.

(13) In the optical information processor (DVD drive), as compared with the conventional discrete optical system, shorter access time can be realized, the process of an optical signal by the reflected beam 24 which is a beam emitted from the semiconductor laser device 16 and reflected by the optical disk 1 can be performed at higher speed, and a smaller memory can be read only by an amount of the refractive index of the dielectric plate 22 as compared with the case of using a semiconductor laser device having the save wavelength as a single light-emitting device. The invention is therefore effective for higher recording density. The optical head 11 of the first embodiment functions even after the number of times of rewriting a recording medium exceeds one million times, and enables the near field recording by which a practical signal process with a low error rate can be performed.

Embodiment II

Figure 13:
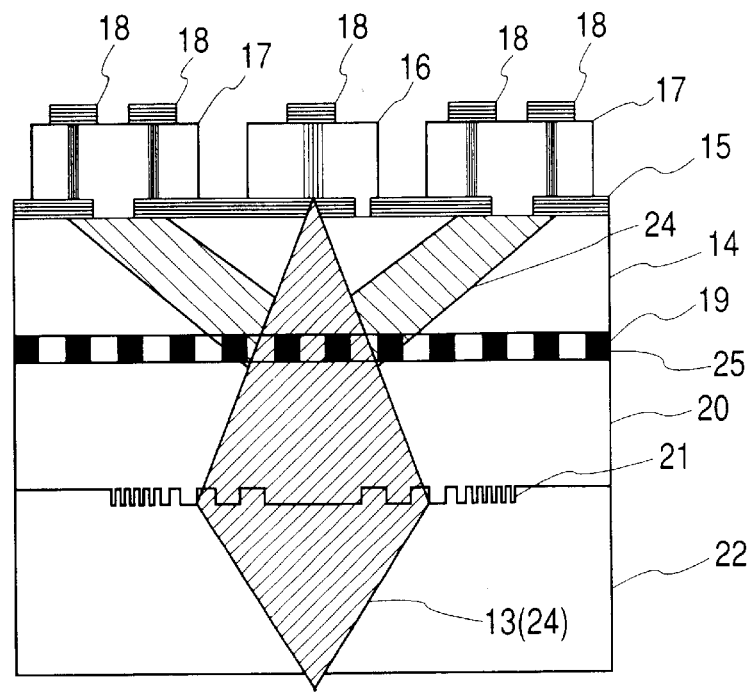
FIG. 13 is a schematic cross section showing an optical head in a DVD drive as another embodiment (second embodiment) of the invention.
Figure 14:
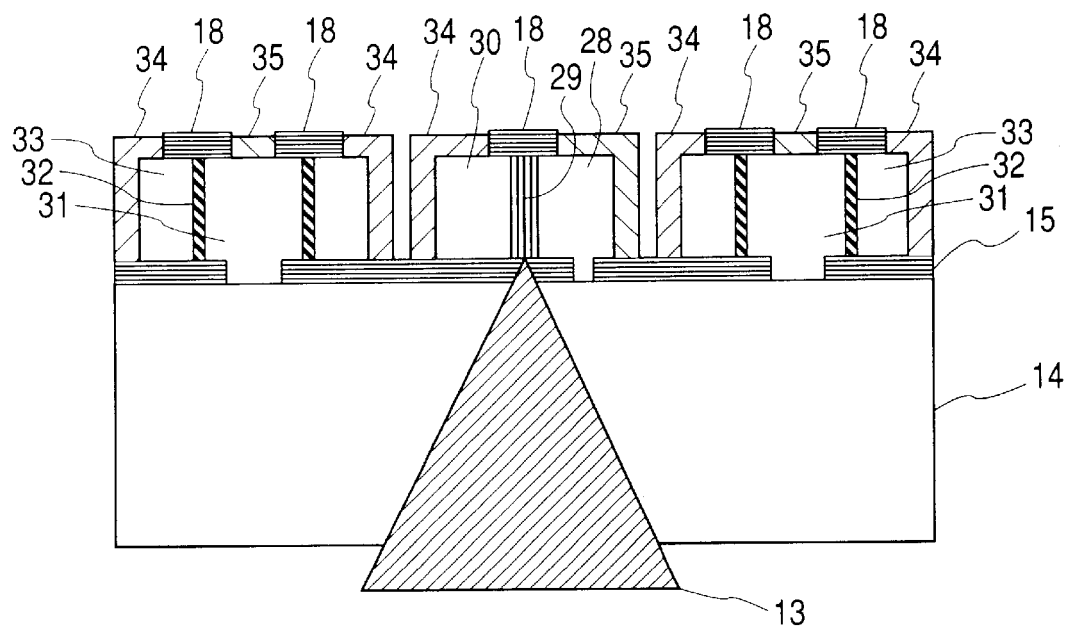
FIG. 14 is a schematic cross section showing a substrate on which a light-emitting device and a light-receiving device are formed in the second embodiment.
Figure 15:
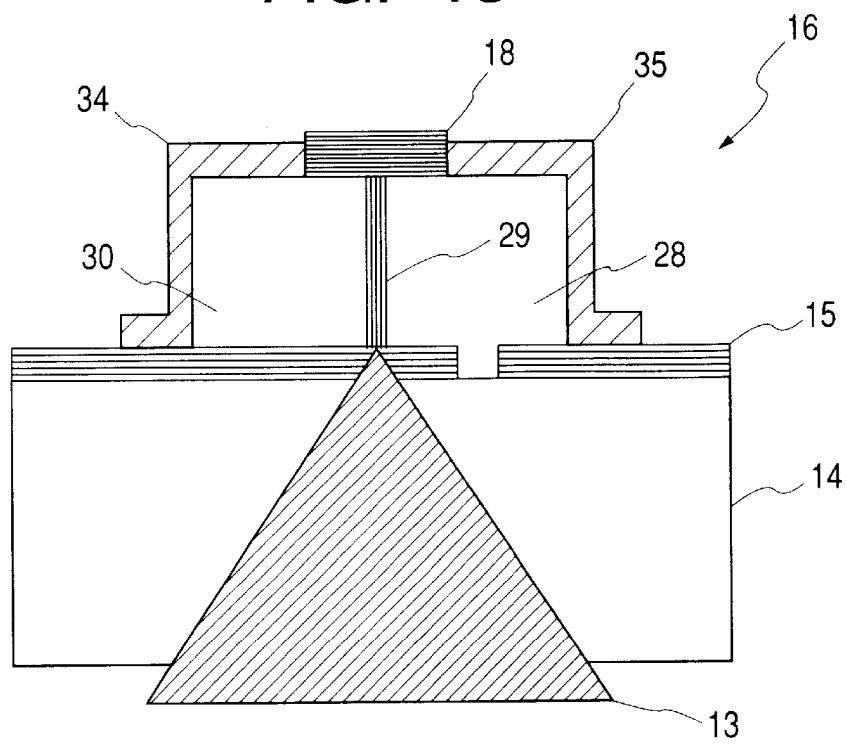
FIG. 15 is a cross section showing the portion of the light-emitting device in the second embodiment.
Figure 16:
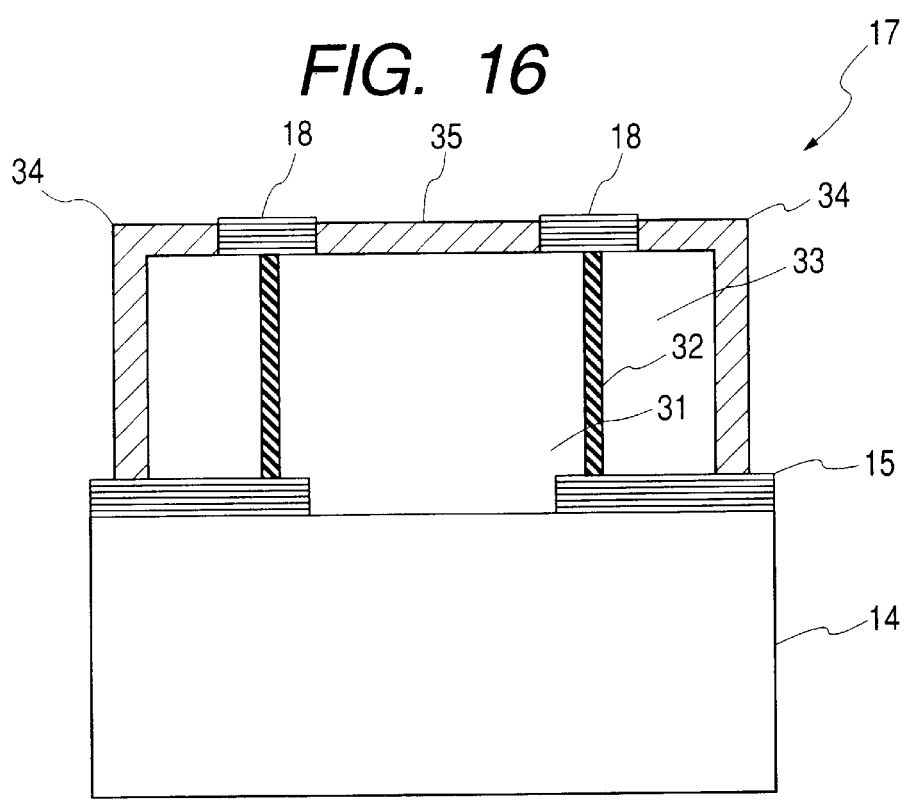
FIG. 16 is a cross section showing the portion of the light-receiving device in the second embodiment.

FIGS. 13 to 16 are diagrams related to a DVD drive according to another embodiment (second embodiment) of the invention. FIG. 13 is a schematic cross section showing an optical head. FIG. 14 is a schematic cross section showing a light-emitting device and a light-receiving device which are integrated. FIG. 15 is a schematic cross section showing the light-emitting device portion. FIG. 16 is a cross section showing the light-receiving device portion.

The optical head 11 of the second embodiment has a structure similar to that of the optical head 11 of the first embodiment except that the structure of the light-emitting device 16 and light-receiving device 17 is different. In FIGS.

13 and 14, for convenience of explanation, the sectional structure of the light-emitting device 16 disposed between the pair of light-receiving devices 17 and the diffraction light separating device 19 are in a state where they are turned by 90 degrees. Similar diagrams will be also used for the embodiments subsequent to the second embodiment.

As shown in FIG. 15, the light-emitting device 16 has an electrode structure different from that of the first embodiment. The anode electrode (p-side electrode) 34 is provided on the surface apart from the reflecting film 18 in the p-type GaN/AlGaN optical waveguide layer 30 provided on the left side of the GaInN/GaN/AlGaN strained multi-quantum-well structure active layer 29. A cathode electrode (n-side electrode) 35 is provided on the surface apart from the reflection film 18 in the n-type GaN/AlGaN optical waveguide layer 28 provided on the right side of the active layer 29.

In the structure, the optical waveguide layer 27 shown in FIGS. 7 and 8 in the first embodiment is unnecessary and can be omitted. Consequently, the insulating film mask 15 is formed on the substrate 14, and the semiconductor layer for forming the light-emitting device 16 can be provided by a single selective growth.

In the first embodiment, the light-receiving device 17 has the face-type light-receiving area. In contrast, the light-receiving device 17 of the second embodiment has, as shown in FIG. 16, a waveguide type light-receiving area.

In the case of the second embodiment, in the first embodiment shown in FIG. 9, a part in the horizontal direction of the p-type optical waveguide layer 33 and the light-receiving layer 32 is removed, the cathode electrode (n-side electrode) 35 is provided in a portion apart from the reflection film 18 at an upper end of the n-type GaN/AlGaN optical waveguide layer 31 surrounded by the GaInN/GaN/AlGaN strained multi-quantum-well structure light-receiving layer 32, and the anode electrode (p-side electrode) 34 is formed in a portion apart from the reflection film 18 in the p-type GaN/AlGaN optical waveguide layer 33 on the outside of the GaInN/GaN/AlGaN strained multi-quantum-well structure light-receiving layer 32, thereby forming the waveguide type light-receiving area.

In the second embodiment, it becomes also necessary to provide the optical waveguide 27 in the first embodiment. Consequently, the insulating film mask 15 is formed on the substrate 14, and the semiconductor layer for forming the light-receiving device 17 can be provided by a single selective growth.

Since the light-receiving device structure of the light-receiving device 17 of the second embodiment is the waveguide type light-receiving layer and the reflection film 18 acts as the high reflection film, the reflected beam from the recording medium is not leaked to the outside but is received more efficiently, so that higher sensitivity can be achieved.

Figure 17:
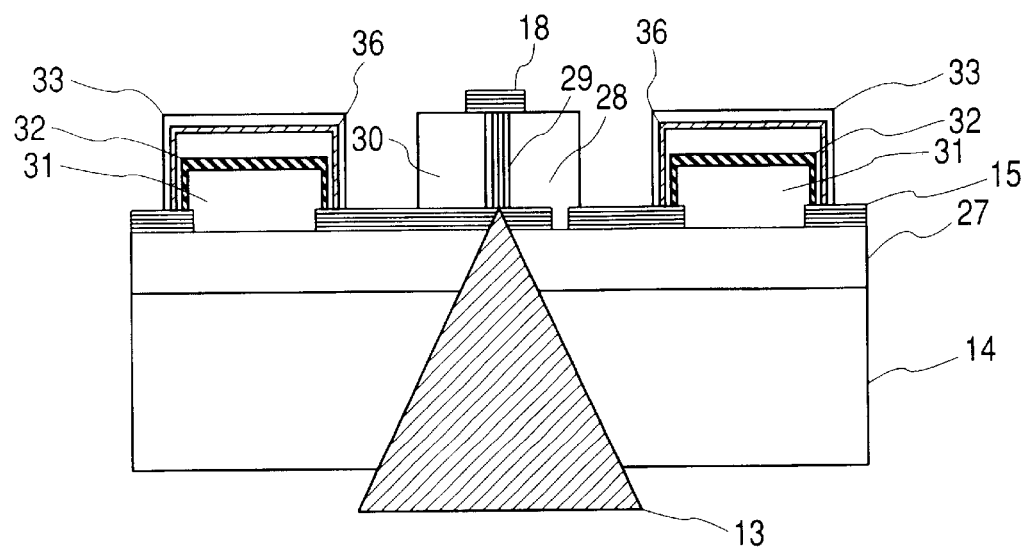
FIG. 17 is a schematic cross section showing a substrate on which a light-emitting device and a light-receiving device are integrated in an optical head of a DVD drive as another embodiment (third embodiment) of the invention.

When the structure of the light-emitting device 16 in FIG. 15 and that of the light-receiving device 17 in FIG. 17 are used, a monolithic integrated device of the light-emitting device and the light-receiving device is as shown in FIG. 14. The configuration of an integrated face-type optical head is as shown in FIG. 13.

In the configuration of FIG. 13, the optical devices under the transparent substrate 14 are quite the same as those of in the configuration of FIG. 4 of the first embodiment. As understood also from FIG. 14, a laser beam emitted form the reflecting mirror 15 of the perpendicular resonator passes through only the transparent substrate 14 and reaches the diffraction light separating device 19, so that a waveguide optical loss can be relatively reduced. Thus improved efficiency for laser beam utilization can be achieved.

In the second embodiment, in addition to the effects, effects similar to those of the first embodiment can be obtained.

Embodiment III

Figure 18:
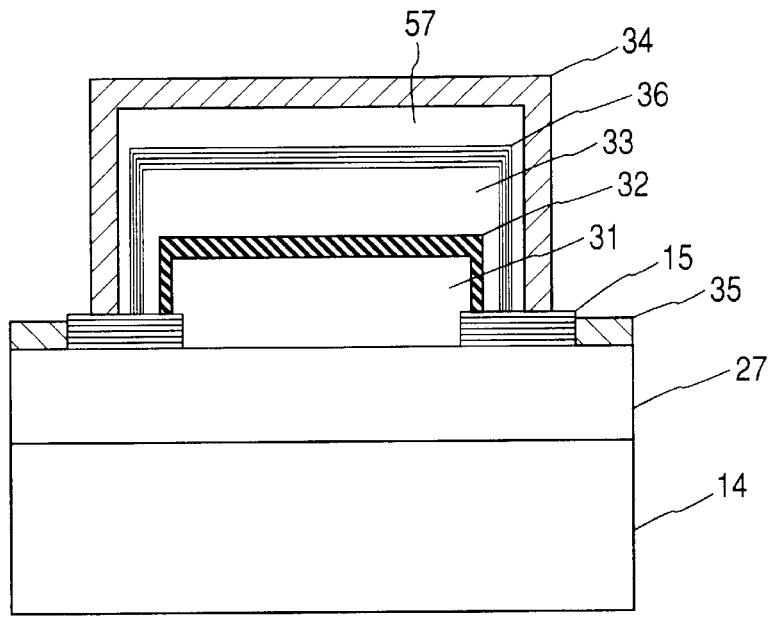
FIG. 18 is a cross section showing the light-receiving device in the third embodiment.

FIGS. 17 and 18 are diagrams related to a DVD drive according to another embodiment (third embodiment) of the invention. FIG. 17 is a schematic cross section showing a light-emitting device and a light-receiving device which are integrated in an optical head. FIG. 18 is a cross section showing the light-receiving device.

In the third embodiment, the integrated face-type optical head 11 is constructed in a manner similar to the foregoing first embodiment. In order to improve the sensitivity of the light-receiving layer in the light-receiving device j18, the structure of the light-receiving device 17 is devised. Specifically, the light-receiving device 17 of the first embodiment has, as shown in FIG. 9, the structure that the n-type GaN/AlGaN optical waveguide layer 31, GaInN/GaN/AlGaN strained multi-quantum-well structure light-receiving layer 32, and p-type GaN/AlGaN optical waveguide layer 33 are provided on the optical waveguide layer 27, and the p-side electrode 34 is further provided on the p-type GaN/AlGaN optical waveguide layer 33. The light-receiving device 17 of the third embodiment has the structure that a high reflection film 36 having a semiconductor superlattice DBR structure is formed on the p-type GaN/AlGaN optical waveguide layer 33, a p-type GAN/AlGaN optical waveguide layer 57 is provided again on the semiconductor superlattice DBR structure high reflection film 36, and the p-side electrode 34 is provided on the p-type GaN/AlGaN optical waveguide layer 57. The high reflection film 36 having the semiconductor superlattice DBR structure can be formed at the time of forming the light-receiving device by selective growth by MOVPE.

The semiconductor superlattice DBR structure high-reflection film 36 reflects a reflected beam travels through the substrate 14, optical waveguide layer 27, n-type GaN/AlGaN optical waveguide layer 31, GaInN/GaN/AlGaN strained multi-quantum-well structure light receiving layer 32, and p-type GaN/AlGaN optical waveguide layer 33 and makes the reflected beam again pass through the GaInN/GaN/AlGaN strained multi-quantum-well structure light-receiving layer 32. Thus, reflection light can be efficiently detected, and improved light-receiving sensitivity can be realized.

Therefore, a current signal and a voltage signal used for a signal process can have higher intensity, so that a signal error rate can be further lowered.

The other effects of the third embodiment are similar to those of the foregoing first embodiment.

Embodiment IV

Figure 19:
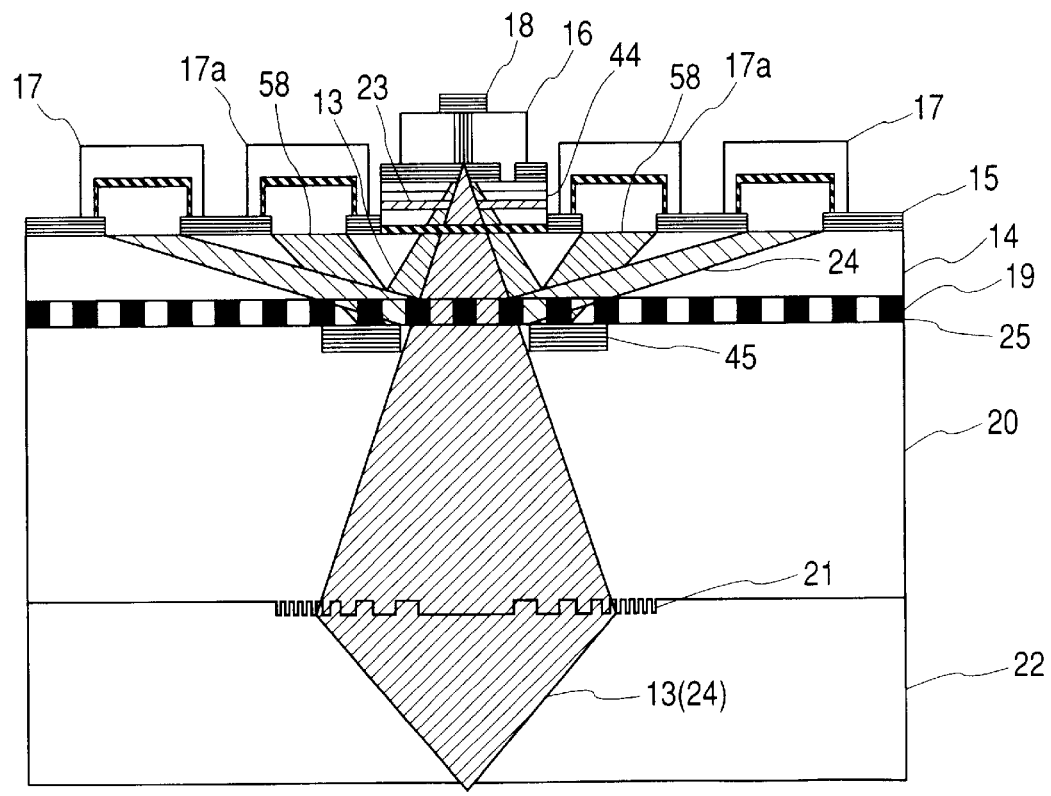
FIG. 19 is a schematic cross section showing an optical head as another embodiment (fourth embodiment) of the invention.
Figure 20:
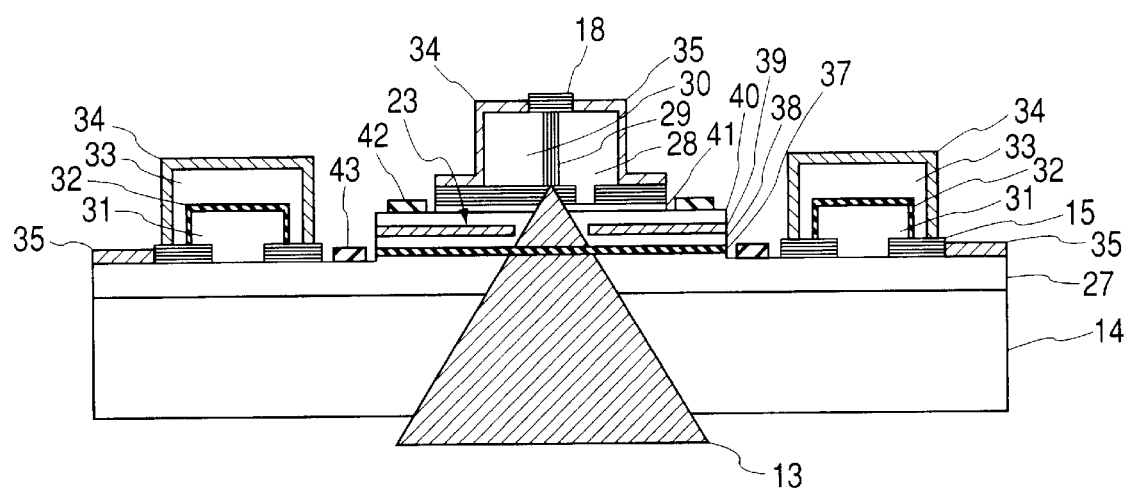
FIG. 20 is a schematic cross section of a substrate showing a part of a light-emitting device and a light-receiving device which are integrated in the fourth embodiment.
Figure 21:
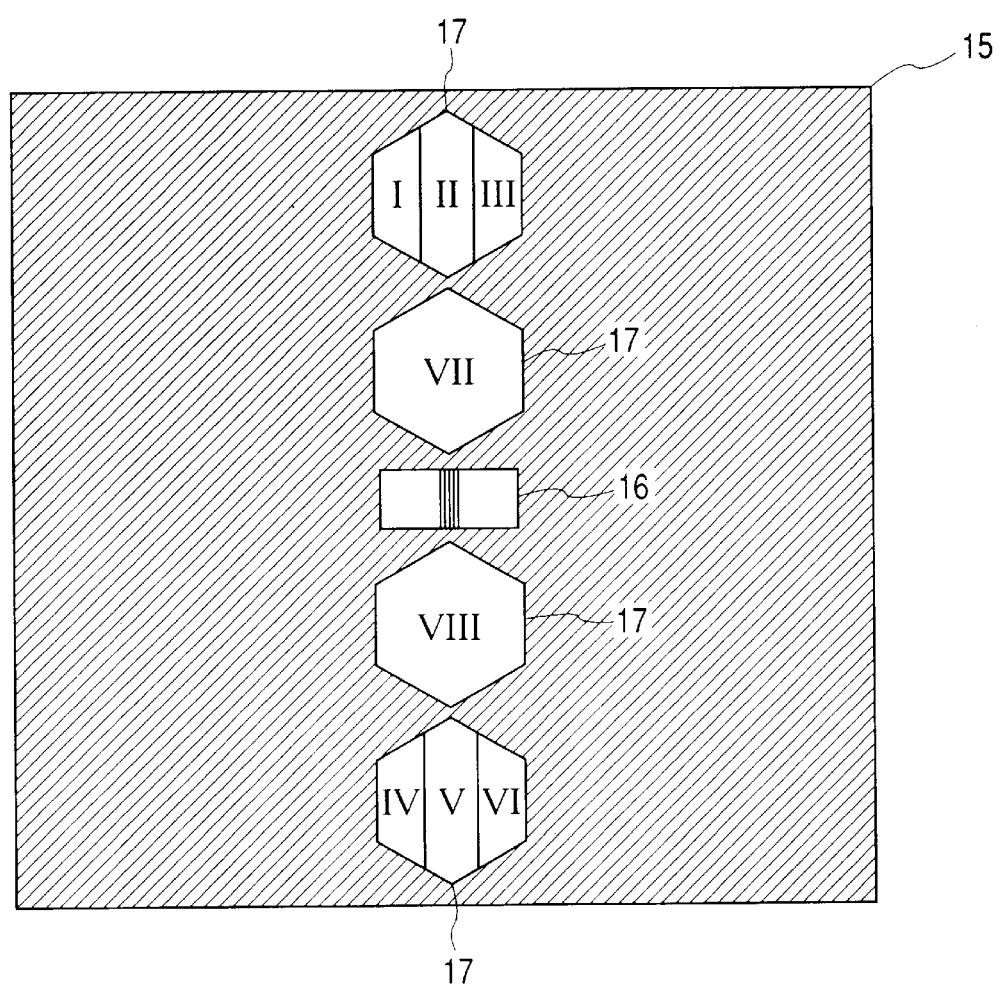
FIG. 21 is a plan view showing a pattern of a selective growth layer for forming the light-emitting device and the light-receiving device formed on the substrate in the fourth embodiment.

FIGS. 19 to 21 are diagrams related to a DVD drive according to another embodiment (fourth embodiment) of the invention. FIG. 19 is a cross section showing an optical head. FIG. 20 is a cross section showing a part of a light-emitting device and a light-receiving device which are integrated. FIG. 21 is a plan view showing a arrangement state of the light-emitting device and the light-receiving device.

In the fourth embodiment, the optical head 11 is an integrated face type optical head in a manner similar to the first embodiment except that an electric field absorbing type modulator 23 is provided below the light-emitting device 16. Continuous beams of the semiconductor laser device 16 are modulated by the modulator 23 and the modulated beams are used as pulse beams. With the configuration, the optical head 11 is adapted to pulse beam writing and erasure to an optical disk recording medium.

In order to provide the electric field absorbing type modulator 23, in a manner similar to the foregoing first embodiment, the optical waveguide layer 27 is provided on one face of the substrate 14. After that, crystal is grown by MOVPE to form a GaInN/GaN/AlGaN strained multi-quantum-well structure electric field absorbing layer 37 and a p-type GaN/AlGaN optical waveguide layer 38 in FIG. 20 are provided.

After that, an insulating film mask 39 is provided and an aperture is formed by lithography and etching process. By using the insulating film mask 39 as a mask for selective growth, a p-type GaN/AlGaN optical waveguide layer 40 and an undoped GaN layer 41.

Subsequently, an etching step as shown in FIG. 20 is formed to reach the optical waveguide layer 27 in the portion corresponding to the area where the light-receiving device is provided. After that, the insulating film mask 15 as a high reflection film is provided, and the light-emitting device and the light-receiving device are provided in a manner similar to the first embodiment. At the time of providing electrodes of the light-emitting device and the light-receiving device, a p-side electrode 42 and an n-side electrode 43 for modulator are formed.

By the above operations, the electric field absorbing type modulator 23 is monolithically integrated on the lower side of the light-emitting device (semiconductor laser device) 16.

The electric field absorbing layer 37 is set to have effective band gap energy of quantum level higher than the energy of the laser beam. By applying a backward bias to the electrodes for modulator, the laser beam is absorbed. According to the magnitude of the backward bias applied to the electrodes for modulator, a pulse signal of a laser beam having a high extinction ratio can be taken.

It is one of the features of the invention that the optical head 11 of the fourth embodiment is provided with a reflection film 45 and the light-receiving device 17 for detecting the reflected beam which does not reach the optical disk of the forward outgoing light of the semiconductor laser device 16.

Specifically, as shown in FIG. 19, a reflection film (dielectric multi-period high-reflection film) 45 made by a dielectric multi-period high-reflection film is provided on a face side of the λ/4 wave plate 20 to be stacked on the diffraction light separating device 19. The dielectric film multi-period high-reflection film 45 is formed in a doughnut shape. The laser beam 13 emitted from the semiconductor laser device 16 passes through the hole of the doughnut shape but the ambient light portion of the laser beam 13 is reflected by the dielectric multi-period high-reflection film 45.

Between the semiconductor laser device 16 and the light-receiving device 17 for detecting the reflected beam 24, the light-receiving device 17 for receiving a reflected beam 58 reflected by the dielectric multi-period high-reflection film 45 is provided.

With the configuration, the peripheral portion of expansion of the laser beam 13 emitted from the semiconductor laser device 16 is reflected by the reflection film 45, and the reflected beam 58 can enter the light-receiving device 17 near to the semiconductor laser device 16. It makes it possible to perform light reception control in which an APC (Automatically Power Control) circuit for performing operation by a constant optical output by using a part of outgoing light of the laser beam 13.

It is set so that the light-receiving device for the APC control out of the light-receiving devices 17 is provided close to the light-emitting device, and the return light which is a ± primary diffracted beams are received by the other light-receiving devices 17. The light-receiving devices are set so as to function independently. By making a design in consideration of the thickness of the substrate 14, disposition of the reflection film 45, and a diffraction angle of the diffraction light separating device 19, it can be achieved to make the light-receiving devices receive light independently.

A laser beam passed through the center portion of the reflection film 45 serves as the transmission beam 13 and is used for recording/reproducing information to/from an optical disk.

By forming the doughnut-shaped hole of the reflection film 45 in the fourth embodiment in a complete circle, the beam spot shape of the transmission beam 13 can be also shaped to a complete circle.

Figure 22:
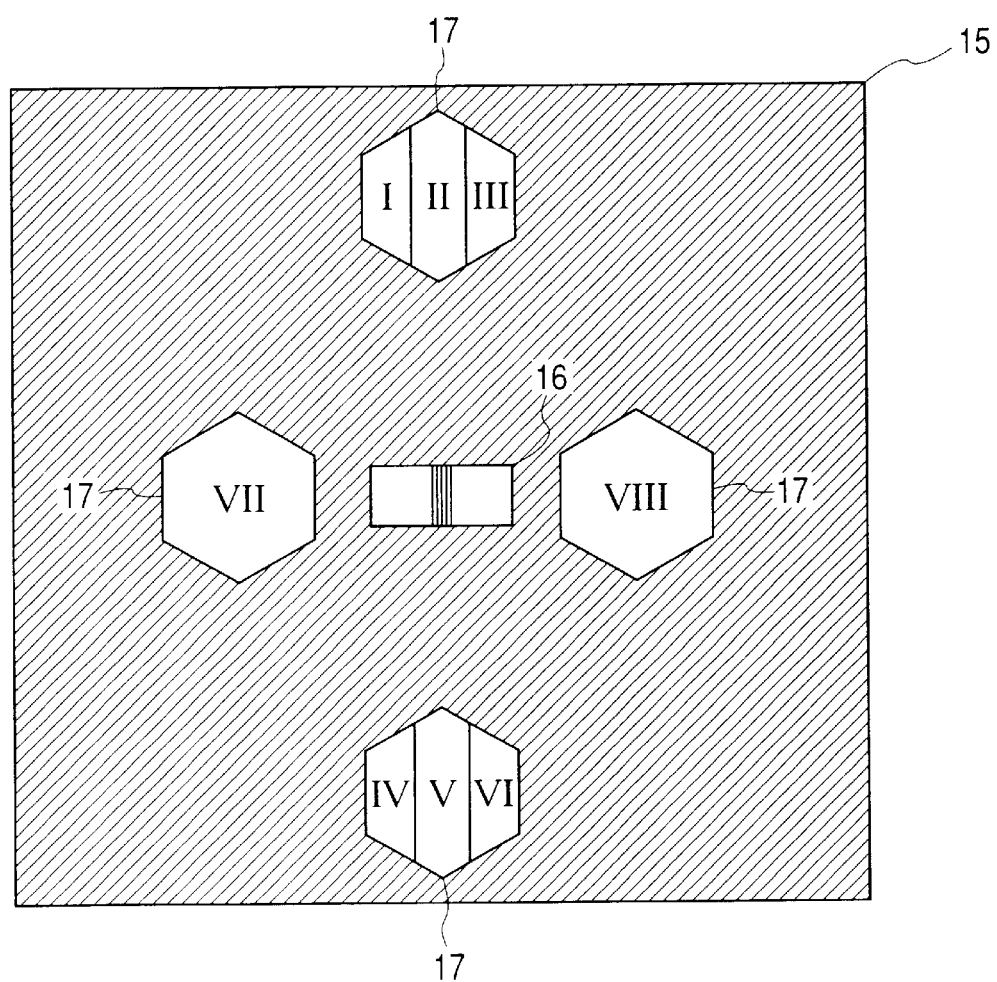
FIG. 22 is a plan view showing a pattern of a selective growth layer for forming a light-emitting device and a light-receiving device formed on the substrate as a modification of the fourth embodiment.

FIG. 21 is a plan view showing a case where the light-receiving device 17 for the APC control is provided close to the light-emitting device 16. The APC control is performed by obtaining a sum signal from a weak current signal received by the light-receiving device VII and a weak current signal received by the light-receiving device VIII. The sum signal is converted by a current-voltage amplifier into a voltage signal. As shown in FIG. 22, it is also possible to realize the function by providing the light-receiving devices VII and VIII for the APC control close to the light-emitting device 16.

According to the fourth embodiment, a completely-round laser beam having high efficiency of coupling to an optical lens can be achieved, and a face-type laser light source capable of modulating a laser beam at hundreds MHz to a few GHz at high speed by an integrated external modulator of an electric field absorbing type can be obtained. By adding the APC control, stable high-speed-modulated pulse beams can be emitted by a constant optical output, and a rectangular optical pulse train following current pulse signals for writing/erasing information to/from a memory in a recording medium can be achieved. Thus, a memory having a higher carrier-to-noise (C/N) ratio and higher resistant to a jitter can be recorded. By mounting the integrated face-type optical head as described above, the optical information processor having relatively simplified optical system and electric circuit system can be constructed.

Embodiment V

Figure 23:
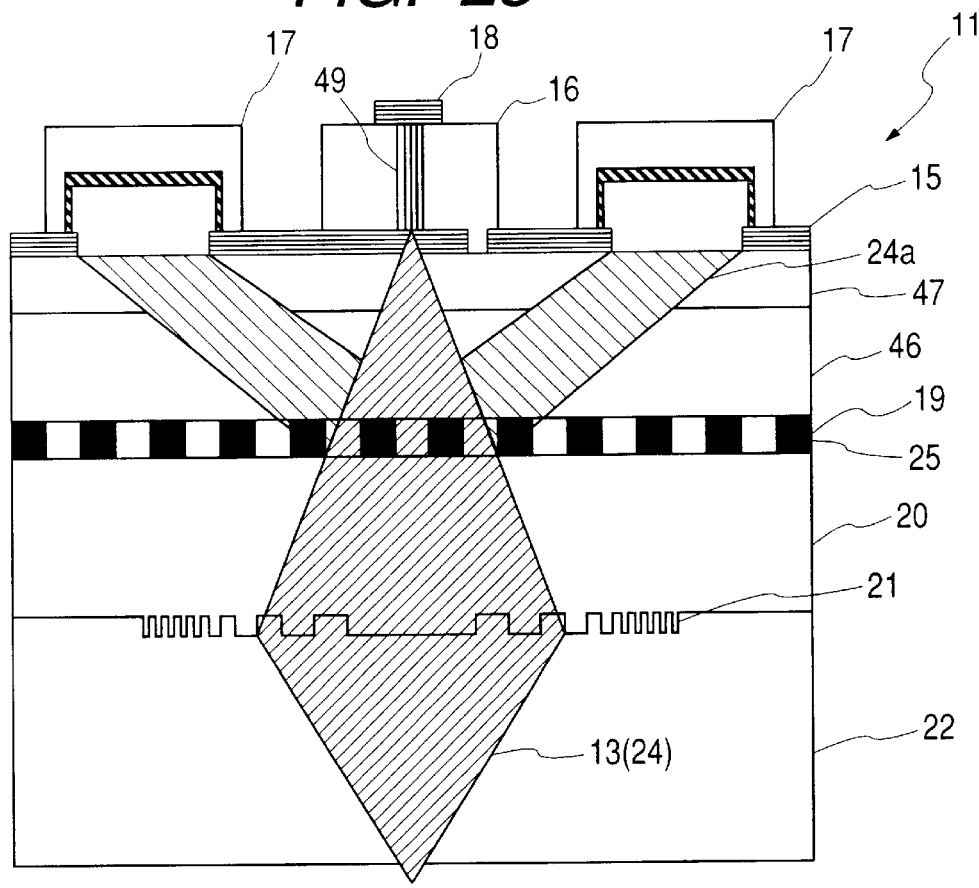
FIG. 23 is a schematic cross section showing an optical head as another embodiment (fifth embodiment) of the invention.
Figure 24:
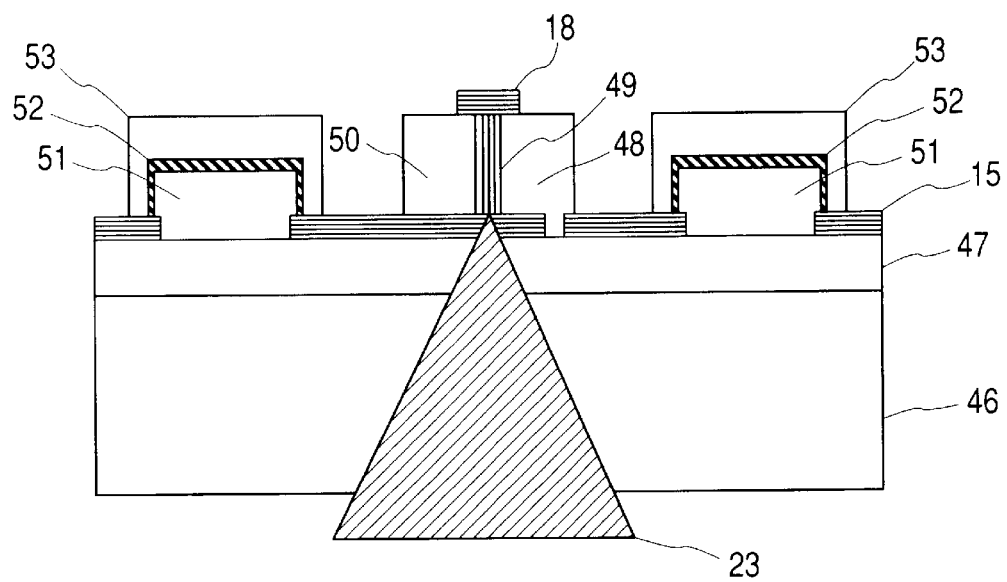
FIG. 24 is a schematic cross section of a substrate showing a part of a light-emitting device and a light-receiving device which are integrated in the fifth embodiment.

FIGS. 23 and 24 are diagrams related to a DVD drive as another embodiment (fifth embodiment) of the invention. FIG. 23 is a cross section showing an optical head. FIG. 24 is a cross section showing a light-emitting device and a light-receiving device which are integrated.

The optical head 11 of the fifth embodiment is an integrated face-type optical head similar to that of the first embodiment but is fabricated by using different materials.

Specifically, the nitride semiconductor material is changed to an AlGaInP material as a phosphorous-based material. By using the AlGaInP material, a light-emitting device and a light-receiving device corresponding to those in FIG. 7 of the first embodiment are formed on the substrate.

When the nitride semiconductor material is used, a laser beam in a wavelength range from ultraviolet to blue-violet is emitted. By using the AlGaInP material as a phosphorus-based material, a laser beam having a red wavelength region is achieved.

First, on a not-shown n-type GaAs substrate having a substrate face of (111) face, an n-type AlGaInP optical waveguide layer 47 including an n-type GaInP layer is provided so as to realize lattice matching by MOVPE.

Subsequently, on the top face of the n-type AlGaInP optical waveguide layer 47 on the n-type GaAs substrate, an n-type GaP substrate 46 having a (111) face as a substrate face is bonded by heat treatment. After that, the n-type GaAs substrate is selectively etched, thereby forming a semiconductor board in which the n-type AlGaInP optical waveguide layer 47 is provided on the n-type GaP substrate 46.

In a manner similar to the first embodiment, the insulating film mask 15 as a high reflection film designed in consideration of the oscillation wavelength of the laser beam of the active layer 49 is formed. After that, the light-emitting device 16 and the light-receiving device 17 are formed. The light-emitting device 16 is formed by selectively growing an n-type AlGaInP optical waveguide layer 48, a GaInP/AlGaInP strained multi-quantum-well structure active layer 49, and a p-type AlGaInP optical waveguide 50 by using the insulating film mask 15 by the MOVPE. The reflection film 18 designed in consideration of the laser beam oscillation wavelength of the active layer 49 is provided on the upper end face of the active layer 49 perpendicular to the substrate face, thereby forming a reflecting mirror of a vertical resonator.

The light-receiving device 17 is selectively grown in a manner similar to the light-emitting device 16, and an -type AlGaInP optical waveguide layer 51, a GaInP/AlGaInP distorted multi-quantum-well structure light receiving layer 52, and a p-type AlGAInP optical waveguide layer 53 are formed. On the surface of the layers 50 and 53, a p-type GaAs layer is formed as a contact layer for an electrode. After providing the p-side electrode and the n-side electrode of the light-emitting device 16 and the light-receiving device 17, the light-emitting device and the light-receiving devices which are monolithically integrated as shown in FIG. 7 of the first embodiment can be constructed.

Below the n-type GaP substrate 46, except for designing in consideration of the oscillation wavelength of a red laser beam emitted from the active layer 49, optical devices are formed in a manner similar to the first embodiment, thereby constructing the integrated face-type optical head 11 shown in FIG. 23. Although the fifth embodiment has been described with respect to the first embodiment, it can be similarly applied to the configurations corresponding to the third and fourth embodiments.

According to the fifth embodiment, the light-emitting device (semiconductor laser device) 16 oscillates at a wavelength of 630 to 690 nm. With the vertical resonator structure as described above, while assuring the completely round fundamental lateral mode, the maximum optical output larger than that of the conventional face-emitting type semiconductor laser device in the oscillation wavelength region can be achieved, and a high-output operation of an optical output of 30 to 70 mW is realized. The other characteristics are similar to those of the integrated face-type optical head of the first embodiment, and the optical devices function similar to those in the first embodiment.

Embodiment VI

Figure 25:
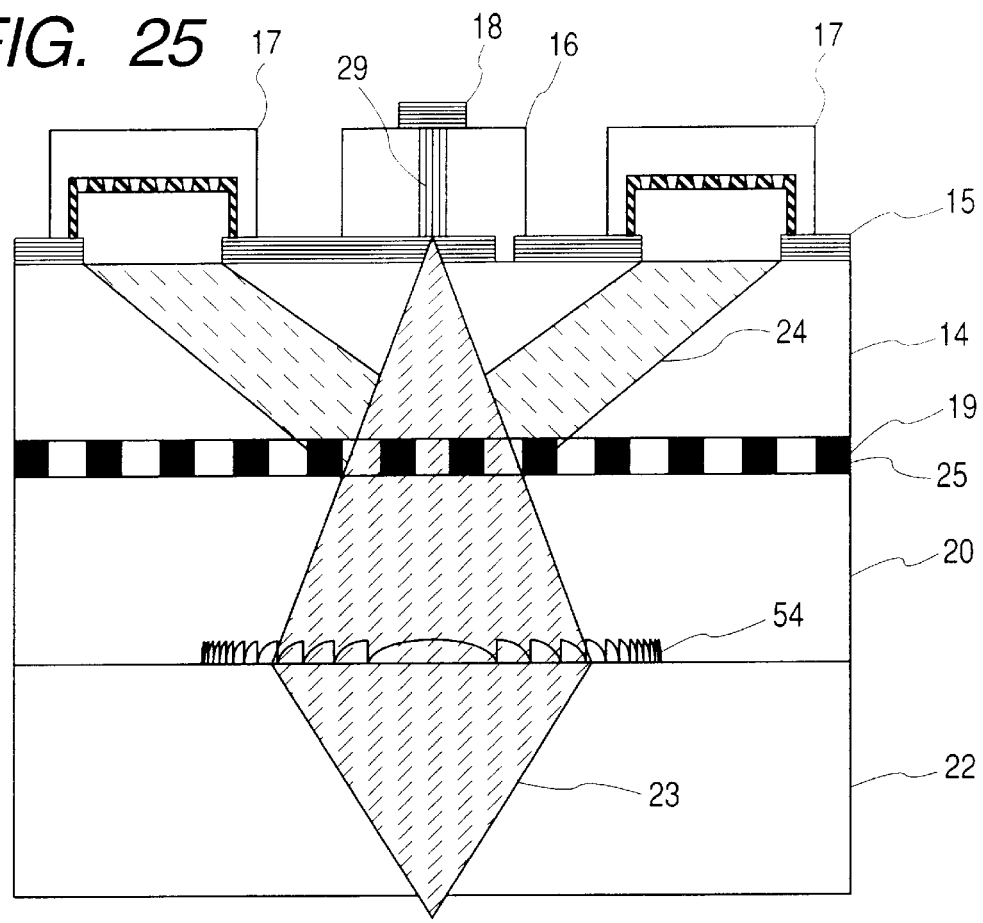
FIG. 25 is a schematic cross section showing an optical head as another embodiment (sixth embodiment) of the invention.
Figure 26:
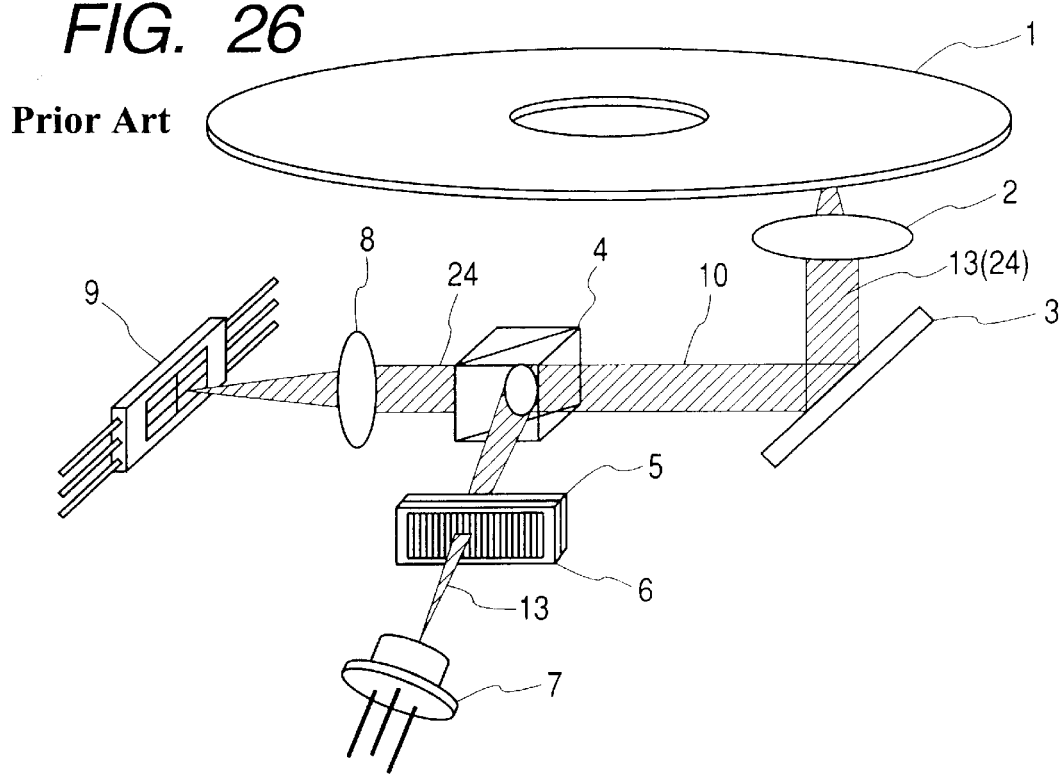
FIG. 26 is a schematic diagram showing an optical pickup mechanism constructed by discrete optical devices in a conventional DVD drive.

FIG. 25 is a cross section showing an optical head according to another embodiment (sixth embodiment) of the invention.

The sixth embodiment is directed to eliminate chromatic aberration by using a phase Fresnel optical lens 54 as a converging lens provided for the dielectric plate 22 of the optical head 11. The configuration can be applied to any of the first to fifth embodiments but an example of applying the configuration to the first embodiment will be described.

Specifically, in the optical head having the configuration of any of the first to fifth embodiments, the converging lens is the converging focus lens in a diffraction grating shape constructed by a groove shape or a diffraction grating having different refractive indices. Consequently, it may cause a case where a color aberration occurs in the light obtained by diffracting and converging a laser beam entered.

In the sixth embodiment, therefore, the converging lens of the optical head 11 is changed to the configuration of the phase Fresnel optical lens 54. The phase Fresnel optical lens 54 has a configuration such that a spherical surface or aspherical surface of a convex lens is cut so that the thickness becomes $\lambda/(n-1)$ where the optical path length is an oscillation wavelength $\lambda$ and n denotes a refractive index of the material of the phase Fresnel optical lens, and resultant shapes are arranged laterally. When the m-th radius of an orbicular zone at the time of forming the lens 54 is expressed as r(m), in consideration of a condition that an average optical path difference of $\lambda$ occurs in beams passing neighboring orbicular zones, r(m) is expressed as $r(m)=(2m\lambda f)^{1/2}$ where f denotes a focal distance of one ray passing an orbicular zone. When the orbicular zone of the lens 54 is formed as shown in FIG. 25, an orbicular zone having the height of $\lambda/(n-1)$ is formed by cutting every radius r(m) as shown by the cross section of FIG. 24. The rays having the wavelength $\lambda$ entering respective orbicular zones are diffracted in the same manner as in the original convex lens and are converged to a common focal point. The rays have one focal distance. The lens 54 can be used as a diffraction light device having an ideal diffraction efficiency of 1, which converges incident light having the wavelength $\lambda$ to a primary spectrum through the frontal aperture.

According to the embodiment, by introducing the lens 54 as the phase Fresnel optical lens, chromatic aberration can be conspicuously reduced, and the lens 54 can ideally act as a convex lens having no chromatic aberration. Consequently, in an optical signal process performed through the optical head 11, memory signal reproduction can be performed with a remarkably high carrier-to-noise (C/N) ratio and with high resistance to jitter. A signal error is suppressed very much, so that the embodiment is effective at reducing a signal error rate.

Although the invention achieved by the inventor herein has been concretely described on the basis of the embodiments, obviously, the invention is not limited by the foregoing embodiments and can be variously modified without departing from the gist. For example, the light-emitting device 16 may be an arbitrary laser device including various laser devices such as, particularly, a semiconductor laser, a solid-state laser, and a gas laser. The substrate 14 having the light-emitting device 16 and the light-receiving device 17, diffraction light separating device 19, and $\lambda/4$ wave plate 20 can be also monolithically formed. The substrate 14 as the base on which the semiconductor layers are grown may be made of $Al_2O_3$, SiC, or the like. On the other face side of the substrate 14, a semiconductor layer, quartz, $Al_2O_3$, or SIC is deposited, a diffraction grating for forming the diffraction light separating device 19 is formed, and after that, the λ/4 wave plate 20 is formed by quartz. In the case of forming the reflection film 45, after forming the diffraction light separating device 19, the reflection film 45 is formed and then the λ/4 wave plate 20 is formed.

In this structure, the substrate, diffraction light separating device, and λ/4 wave plate are formed monolithically, so that an optical loss in the interfaces of the substrate, diffraction light separating device, and λ/4 wave plate is extremely small and the efficiency for laser beam utilization is further improved.

By a structure in which the substrate, diffraction light separating device, λ/4 wave plate, and a dielectric plate having a converging lens are bonded to be mechanically and physically integrated by a transparent bonding material, effects similar to those of the foregoing embodiments can be produced.

Although the example of applying the invention achieved by the inventor herein to a DVD drive has been described above, the invention can be also similarly applied to an optical information processor other than the DVD drive, such as a drive for CD, CD-R, or the like.

According to the invention, an optical information process as described below can be realized.

(1) By disposing a light-emitting device (semiconductor laser device in a vertical resonator structure) and light-receiving devices on one face of a transparent substrate and integrating sequentially, hierarchically a diffraction light separating device, a λ/4 wave plate, and a diffracting-grating-state converging focus lens on the other face of the substrate, an optical path is shortened, and an optical head capable of recording/reproducing a near field image is constructed. Thus, optical recording of high recording density can be achieved.

(2) By disposing a light-emitting device (semiconductor laser device in a vertical resonator structure) and light-receiving devices on one face of a transparent substrate and integrating sequentially, hierarchically a diffraction light separating device, a λ/4 wave plate, and a diffracting-grating-state converging focus lens on the other face of the substrate, a small, light optical head is constructed. Consequently, the optical head according to the invention can be directly attached to a suspension arm as a slider, the operation can be performed at higher speed as compared with the conventional techniques, and optical recording/reproduction can be achieved at higher-speed access.

(3) In the semiconductor laser device having the vertical resonator structure, while assuring a completely round fundamental lateral mode, laser operation of a higher output as compared with the conventional face-emitting type laser device can be achieved.

(4) The light-receiving device and the light-emitting device can be monolithically integrated.

(5) Since the optical path length can be remarkably shortened by the configuration of the optical head in (1), the efficiency of laser beam utilization can be improved, and improved sensitivity of the light-receiving device can be achieved.

(6) By the above (1) and (2), in an optical information processor, focusing on a memory in an optical recording medium, tracking correction, higher processing speed by shortened access time can be realized, and the smallest memory which cannot be read by the conventional optical head techniques can be read.

(7) By applying the invention to an optical information processor of the next generation such as a ROM or RAM of a digital video disk (DVD), an information signal process can be performed at high recording density and at high speed. Thus, the configuration of an optical pickup system in the optical information processor can be further simplified, and reduction in the manufacturing cost of the optical information processor can be achieved.

What is claimed is:

1. An optical information processor for reproducing information recorded on a recording medium and/or recording information to the recording medium, comprising:

a substrate having, on one face thereof, a light-emitting device for emitting a transmission beam in an in-plane direction and a plurality of light-receiving devices for receiving reflected beams of said transmission beam from the inside of the plane, said substrate being made of a base material capable of forming said light-emitting device and said light-receiving devices by crystal growth and an insulating material through which said transmission beam and said reflected beams pass;

a diffraction light separating device stacked on the other face of said substrate, for correcting and changing an optical path so that the reflected beams from said recording medium are received by said light-receiving device;

a λ/4 wave plate stacked on said diffraction light separating device; and a dielectric plate stacked on said λ/4 wave plate, constructing a lens for converging said transmission beam onto a recording face of said recording medium and converging the reflected beams from said recording medium onto said substrate, wherein the light-emitting device for emitting the transmission beam into said in-plane direction is a semiconductor laser having an active layer with a vertical cavity parallel to the outgoing direction of the transmission beam, wherein an image is formed on a recording face of the recording medium by the transmission beam emitted from a light-outgoing end of said light-emitting device and another image is formed on a light-receiving face of said light-receiving devices by said reflected beams reflected by said recording face, wherein said plurality of light-receiving devices include at least a first and a second three-area light-receiving devices, each of which is placed on one side of said light-emitting device along a move line of said recording medium for reproducing information recorded on said recording medium, and each of the three light-receiving devices is divided into one central area and two neighboring areas along the move line with said central area placed on the move line, and wherein tracking of the transmission beam is corrected by a difference between detected signal sums of the neighboring areas of the first and the second three-area light-receiving devices on one side of the move line versus the other side of the move line.

2. An optical information processor for reproducing information recorded on a recording medium and/or recording information to the recording medium, comprising:

a substrate having, on one face thereof, a light-emitting device for emitting a transmission beam in an in-plane direction and a plurality of light-receiving devices for receiving reflected beams of said transmission beam from the inside of the plane, said substrate being made of a base material capable of forming said light-emitting device and said light-receiving devices by crystal growth and an insulating material through which said transmission beam and said reflected beams pass;

a diffraction light separating device stacked on the other face of said substrate, for correcting and changing an optical path so that the reflected beams from said recording medium are received by said light-receiving device;

a $\lambda/4$ wave plate stacked on said diffraction light separating device; and a dielectric plate stacked on said $\lambda/4$ wave plate, constructing a lens for converging said transmission beam onto a recording face of said recording medium and converging the reflected beams from said recording medium onto said substrate, wherein the light-emitting device for emitting the transmission beam into said in-plane direction is a semiconductor laser having an active layer with a vertical cavity parallel to the outgoing direction of said transmission beam, wherein an image is formed on a recording face of the recording medium by the transmission beam emitted from a light-outgoing end of said light-emitting device and another image is formed on a light-receiving face of said light-receiving devices by said reflected beams reflected by said recording face, wherein said plurality of light-receiving devices include at least a first and a second three-area light-receiving devices, each of which is placed on one side of said light-emitting device along a move line of said recording medium for reproducing information recorded on said recording medium, and each of the three light-receiving devices is divided into one central area and two neighboring areas along the move line with said central area placed on the move line, and wherein a focus of the transmission beam is corrected by a difference between a detected signal sum of the central area of the first three-area light-receiving device and two neighboring areas of the second three-area light-receiving device, and a detected signal sum of the central area of the second three-area light-receiving device and two neighboring areas of the first three-area light-receiving device.

3. The optical information processor according to claim 1, wherein a modulator for controlling the transmission beam emitted from said light-emitting device is provided in the substrate portion on the front light-outgoing side of said light-emitting device.

4. The optical information processor according to claim 1, wherein said substrate, said diffraction light separating device, said $\lambda/4$ wave plate, and said dielectric plate are integrated.

5. The optical information processor according to claim 1, wherein said substrate, said diffraction light separating device, said $\lambda/4$ wave plate, and said dielectric plate are integrated mechanically and physically.

6. The optical information processor according to claim 5, wherein said substrate, said diffraction light separating device, said $\lambda/4$ wave plate, and said dielectric plate are bonded by a transparent bonding material.

7. The optical information processor according to claim 5, wherein said substrate, said diffraction light separating device, said $\lambda/4$ wave plate, and said dielectric plate are bonded by an intermolecular force of thermo compression bonding under high vacuum of about $10^{-9}$ to $10^{-10}$ Torr.

8. The optical information processor according to claim 1, wherein said substrate, said diffraction light separating device, said $\lambda/4$ wave plate, and said dielectric plate are formed monolithically.

9. The optical information processor according to claim 1, wherein said lens is constructed so as to form an image as a near field image on a recording face of a recording medium by said transmission beam and to reproduce/record information of near-field recording from/to the recording medium.

10. The optical information processor according to claim 9, wherein said near field image is formed in a range from a few nm to a few hundreds nm from the surface of said dielectric plate.

11. The optical information processor according to claim 1, wherein each of said lens and the diffraction light separating device is formed by a diffraction grating, when a diffraction grating lens is used as said lens, the reflected beam is diffracted to generate a primary diffracted beam, the diffracted primary beam is separated via the diffraction light separating device, and separated beams are received by said light-receiving devices.

12. The optical information processor according to claim 11, wherein said diffraction grating is constructed by at least two kinds of areas having different refractive indices and is, desirably formed in a crystal having high anisotropy.

13. The optical information processor according to claim 12, wherein the at least two kinds of areas having different refractive indices in said diffraction grating are formed by diffusion of an impurity or ion implantation.

14. The optical information processor according to claim 1, wherein said light-emitting device is a semiconductor laser formed from a semiconductor crystal as a base formed by selective growth using an insulating mask on one face of said substrate, an active layer for emitting a laser beam from its end face is disposed along a direction perpendicular to one face of said substrate on which said light-emitting device is provided, and induced-emission light is resonated and amplified in a direction perpendicular to said substrate face.

15. The optical information processor according to claim 14, wherein a reflection film is provided at both ends of the active layer of said light-emitting device, the reflection film of the front light-outgoing end of said active layer is constructed by the insulating mask used for selectively growing a semiconductor crystal on one face of said substrate, and reflectance of the reflection film at the front outgoing end is lower than that of the reflection film of the other end.

16. The optical information processor according to claim 1, wherein the active layer of said light-emitting device has a multi-quantum-well structure or a strained multi-quantum-well structure obtained by introducing a lattice distortion into a quantum well layer.

17. The optical information processor according to claim 1, further comprising:

a pair of light-receiving devices with one placed between said light-emitting device and the first three-area light-receiving devices and the other placed between said light-emitting device and the second three-area light-receiving device, wherein optical output of the transmission beam is controlled based on detected signals of said pair of light-receiving devices.

18. The optical information processor according to claim 2, further comprising:
  a pair of light-receiving devices with one placed between said light-emitting device and the first three-area light-receiving devices and the other placed between said light-emitting device and the second three-area light-receiving device,
  wherein optical output of the transmission beam is controlled based on detected signals of said pair of light-receiving devices.

19. The optical information processor according to claim 1, further comprising:
  a pair of light-receiving devices placed at two sides of said light-emitting device perpendicularly to the move line,
  wherein optical output of the transmission beam is controlled based on detected signals of said pair of light-receiving devices.

20. The optical information processor according to claim 2, further comprising:
  a pair of light-receiving devices placed at two sides of said light-emitting device perpendicularly to the move line,
  wherein optical output of the transmission beam is controlled based on detected signals of said pair of light-receiving devices.

21. The optical information processor according to claim 1, further comprising:
  a reflector for reflecting a peripheral portion of the transmission beam emitted from said light-emitting device is provided between said diffraction light separating device and said $\lambda/4$ wave plate, wherein the reflected beam of the transmission beam reflected by said reflector falls on a light-receiving face of said light-receiving device for detecting the optical output of the transmission beam.

22. The optical information processor according to claim 2, further comprising:
  a reflector for reflecting a peripheral portion of the transmission beam emitted from said light-emitting device is provided between said diffraction light separating device and said $\lambda/4$ wave plate, wherein the reflected beam of the transmission beam reflected by said reflector falls on a light-receiving face of said light-receiving device for detecting the optical output of the transmission beam.

* * * * *